(12) United States Patent
Liesener et al.

(10) Patent No.: US 8,189,202 B2
(45) Date of Patent: May 29, 2012

(54) INTERFEROMETER FOR DETERMINING OVERLAY ERRORS

(75) Inventors: Jan Liesener, Middletown, CT (US); Xavier Colonna de Lega, Middlefield, CT (US); Peter de Groot, Middletown, CT (US)

(73) Assignee: Zygo Corporation, Middlefield, CT (US)

(*) Notice: Subject to any disclaimer, the term of this patent is extended or adjusted under 35 U.S.C. 154(b) by 420 days.

(21) Appl. No.: 12/535,357

(22) Filed: Aug. 4, 2009

(65) Prior Publication Data

US 2011/0032535 A1 Feb. 10, 2011

(51) Int. Cl.
*G01B 11/02* (2006.01)

(52) U.S. Cl. ...................................... 356/508

(58) Field of Classification Search .......... 356/399–401, 356/490, 508, 509, 510
See application file for complete search history.

(56) References Cited

U.S. PATENT DOCUMENTS

| | | | |
|---|---|---|---|
| 5,398,113 A | 3/1995 | de Groot | |
| 5,483,343 A | 1/1996 | Iwamoto et al. | |
| 6,804,005 B2 | 10/2004 | Bischoff et al. | |
| 6,819,426 B2* | 11/2004 | Sezginer et al. | 356/401 |
| 6,856,408 B2 | 2/2005 | Raymond | |
| 6,937,344 B2* | 8/2005 | Monshouwer et al. | 356/508 |
| 7,042,569 B2* | 5/2006 | Sezginer et al. | 356/401 |
| 7,061,615 B1 | 6/2006 | Lowe-Webb | |
| 7,139,081 B2 | 11/2006 | de Groot | |
| 7,230,705 B1 | 6/2007 | Yang et al. | |
| 7,289,213 B2 | 10/2007 | Mieher et al. | |
| 7,324,214 B2 | 1/2008 | de Groot | |
| 7,428,057 B2 | 9/2008 | de Lega | |
| 2002/0080364 A1* | 6/2002 | Monshouwer et al. | 356/508 |
| 2002/0158193 A1* | 10/2002 | Sezginer et al. | 250/237 G |
| 2004/0085544 A1 | 5/2004 | de Groot | |
| 2004/0189999 A1 | 9/2004 | de Groot et al. | |
| 2005/0012928 A1* | 1/2005 | Sezginer et al. | 356/401 |
| 2005/0018190 A1* | 1/2005 | Sezginer et al. | 356/401 |
| 2005/0275848 A1* | 12/2005 | Hill | 356/512 |

(Continued)

FOREIGN PATENT DOCUMENTS

WO   WO 94/00733   1/1994

OTHER PUBLICATIONS

J. Petit et al., "Improved CD and overlay metrology using an Optical Fourier Transform instrument", SPIE vol. 5752, pp. 420-428 (2005).

(Continued)

*Primary Examiner* — Michael A Lyons
(74) *Attorney, Agent, or Firm* — Fish & Richardson P.C.

(57) ABSTRACT

Systems are disclosed that include an interferometer configured to direct test light to an overlay test pad and subsequently combine it with reference light, the test and reference light being derived from a common source, one or more optics configured to direct at least a portion of the combined light to a multi-element detector so that different regions of the detector correspond to different illumination angles of the overlay test pad by the test light, the detector being configured to produce an interference signal based on the combined light, and an electronic processor in communication with the multi-element detector. The overlay test pad comprises a first patterned structure and a second patterned structure and the electronic processor is configured to determine information about the relative alignment between the first and second patterned structures based on the interference signal.

46 Claims, 19 Drawing Sheets

U.S. PATENT DOCUMENTS

| | | |
|---|---|---|
| 2006/0158657 A1 | 7/2006 | de Lega |
| 2006/0158658 A1 | 7/2006 | de Lega |
| 2006/0158659 A1 | 7/2006 | de Lega et al. |
| 2009/0262362 A1* | 10/2009 | de Groot et al. .............. 356/508 |
| 2011/0032535 A1* | 2/2011 | Liesener et al. .............. 356/511 |
| 2011/0215442 A1* | 9/2011 | Shneyder et al. ............. 257/621 |

OTHER PUBLICATIONS

J. Schmit P. Hariharan, "Improved polarization Mirau interference microscope", Optical Engineering, vol. 46(7), (Jul. 2007).

* cited by examiner

INTERFEROMETER FOR DETERMINING OVERLAY ERRORS

BACKGROUND

The invention relates to interferometry, and to using interferometry for determining overlay errors.

Interferometric techniques are commonly used to measure the profile of a surface of an object. To do so, an interferometer combines a measurement wavefront reflected from the surface of interest with a reference wavefront reflected from a reference surface to produce an interferogram. Fringes in the interferogram are indicative of spatial variations between the surface of interest and the reference surface.

A scanning interferometer scans the optical path length difference (OPD) between the reference and measurement legs of the interferometer over a range comparable to, or larger than, the coherence length of the interfering wavefronts, to produce a scanning interferometry signal for each camera pixel used to measure the interferogram. A limited coherence length can be produced, for example, by using a white-light source, which is referred to as scanning white light interferometry (SWLI). A typical scanning white light interferometry (SWLI) signal is a few fringes localized near the zero optical path difference (OPD) position. The signal is typically characterized by a sinusoidal carrier modulation (the "fringes") with bell-shaped fringe-contrast envelope. The conventional idea underlying SWLI metrology is to make use of the localization of the fringes to measure surface profiles.

SWLI processing techniques include two principle trends. The first approach is to locate the peak or center of the envelope, assuming that this position corresponds to the zero optical path difference (OPD) of a two-beam interferometer for which one beam reflects from the object surface. The second approach is to transform the signal into the frequency domain and calculate the rate of change of phase with wavelength, assuming that an essentially linear slope is directly proportional to object position. See, for example, U.S. Pat. No. 5,398,113 to Peter de Groot. This latter approach is referred to as Frequency Domain Analysis (FDA).

Scanning interferometry can be used to measure surface topography and/or other characteristics of objects having complex surface structures, such as thin film(s), discrete structures of dissimilar materials, or discrete structures that are underresolved by the optical resolution of an interference microscope. By "underresolved" it is meant that the individual features of the object are not fully separated in a surface profile image taken using the interference microscope as a consequence of the limited lateral resolution of the instrument. Surface topography measurements are relevant to the characterization of flat panel display components, semiconductor wafer metrology, and in-situ thin film and dissimilar materials analysis. See, e.g., U.S. Patent Publication No. US-2004-0189999-A1 by Peter de Groot et al. entitled "Profiling Complex Surface Structures Using Scanning Interferometry" and published on Sep. 30, 2004, the contents of which are incorporated herein by reference, and U.S. Patent Publication No. US-2004-0085544-A1 by Peter de Groot entitled "Interferometry Method for Ellipsometry, Reflectometry, and Scatterometry Measurements, Including Characterization of Thin Film Structures" and published on May 6, 2004, the contents of which are incorporated herein by reference.

Other techniques for optically determining information about an object include ellipsometry and reflectometry. Ellipsometry determines complex reflectivity of a surface when illuminated at an oblique angle, e.g., 60°, sometimes with a variable angle or with multiple wavelengths. To achieve greater resolution than is readily achievable in a conventional ellipsometer, microellipsometers measure phase and/or intensity distributions in the back focal plane of the objective, also known as the pupil plane, where the various illumination angles are mapped into field positions. Such devices are modernizations of traditional polarization microscopes or "conoscopes," linked historically to crystallography and mineralogy, which employs crossed polarizers and a Bertrand lens to analyze the pupil plane in the presence of birefringent materials.

Conventional techniques used for thin film characterization (e.g., ellipsometry and reflectometry) rely on the fact that the complex reflectivity of an unknown optical interface depends both on its intrinsic characteristics (material properties and thickness of individual layers) and on three properties of the light that is used for measuring the reflectivity: wavelength, angle of incidence, and polarization state. In practice, characterization instruments record reflectivity fluctuations resulting from varying these parameters over known ranges. Optimization procedures such as least-squares fits are then used to get estimates for the unknown parameters by minimizing the difference between measured reflectivity data and a reflectivity function derived from a model of the optical structure.

Interferometers having multiple modes for determining characteristics of an object are disclosed in US 2006-0158657 A1 (now U.S. Pat. No. 7,428,057) and US 2006-0158658 A1, the entire contents both of which are incorporated herein by reference.

SUMMARY

The disclosure relates generally to using low coherence interferometry for metrology during semiconductor processing, in which precise overlay registration (i.e., the relative orientation and position) of patterned layers is a fundamental requirement. Traditional methods of overlay registration include specially designed patterned features ("registration marks") that are easily resolved using a conventional imaging microscope. Common among these registration marks are, for example, the box-in-box features, which are analyzed using machine vision technology to determine overlay registration.

Low coherence interferometers, typically used to measure surface topographies, can be configured to provide complex reflectivity information of an object for different wavelengths and illumination angles. For example, complex reflectivity information can be obtained by imaging a pupil plane of the interference objective onto the camera, instead of imaging the object under test (such configurations are referred to herein as "pupil plane SWLI" or "PUPS"). In PUPS, different points in the pupil represent different illumination angles (i.e., angle of incidence and azimuth angle). Scanning the test object with respect to the interferometer's reference leads to an intensity modulation in the interference pattern which is captured by the camera. Fourier transform algorithms (or related algorithms) reveal spectral information of the light reflected from the object (i.e., the complex reflectivities (magnitude and phase)) for a large number of wavelengths, angles of incidence and azimuth angles.

This disclosure features techniques for applying PUPS interferometry to overlay metrology. In general, for a technique to be useful for overlay metrology, it should provide a signal that is sensitive to overlay errors for a range of error values consistent with its application. The inventors have recognized that without making appropriate adjustments to the measurements, PUPS interferometry can produce a signal that has poor sensitivity to overlay changes. It is believed that poor sensitivity in regular PUPS interferometry is due to fundamental symmetry principles that lead to a parabolic behavior of the measured reflectivities as a function of overlay, with vanishing slope for zero overlay (i.e., where there is no overlay error and hence the resulting test structure is perfectly symmetric with respect to the PUPS interrogation). Accordingly, approaches for gaining sensitivity to overlay are presented.

Generally, these approaches involve providing configurations that lead to non-zero slopes of the measured PUPS signal. For example, in some embodiments, non-zero overlay offsets are provided in the overlay targets, thereby driving the measured signals out of the areas with zero slope. In other words, instead of an overlay error free target structure being symmetric, the structure is deliberately designed so that an error free target is asymmetric instead. Thus, deviations from the error free asymmetric structure result in measurable changes in the PUPS signal.

Alternatively, or additionally, PUPS interferometry system hardware itself can be modified to provide the desired signal asymmetry. For example, in some embodiments, one can use dissimilar orientations of polarizer and analyzer in the illumination and imaging legs of the interferometer, respectively. It is believed that in such configurations, the symmetry properties of the optical system change and lead to non-zero slope of the measured signals even at zero overlay.

Both target and hardware approaches can benefit from the concept of differential measurements which makes overlay error calculations less dependent on or fully independent of optical modeling. Differential measurements use a set of overlay targets for which the relative overlay difference between the targets is known. The overlay error further offsets the overlay of all targets in the set by the same amount. The break of fundamental signal symmetries becomes indicative of the overlay error. Overlay-induced asymmetries can appear either in single measurements or when comparing a series of measurements. Generally, one needs to make certain assumptions about the signal behavior as a function of the overlay (e.g., a functional fit) since the signal is measured for only a discrete set of overlay values.

In certain embodiments, the techniques involve model-based overlay measurements. Model-based overlay measurements make use of simulated signals, where the overlay is the only one or among multiple variable model parameters. Generally, it is desirable to have as few variable model parameters as possible. With that goal in mind, it can be helpful to gather other structure information from other (e.g., independent) measurements, for instance from previous critical dimension ("CD") measurements using the same PUPS hardware in a different polarizer configuration. Optimally, such procedures can lead to a reduction of the number of test pads (i.e., different overlay targets) required to accurately measure overlay in a wafer.

We now summarize various aspects and features of the invention.

In general, in one aspect, the invention features a system that includes an interferometer configured to direct test light to an overlay test pad and subsequently combine it with reference light, the test and reference light being derived from a common source, one or more optics configured to direct at least a portion of the combined light to a multi-element detector so that different regions of the detector correspond to different illumination angles of the overlay test pad by the test light, the detector being configured to produce an interference signal based on the combined light, and an electronic processor in communication with the multi-element detector. The overlay test pad comprises a first patterned structure and a second patterned structure and the electronic processor is configured to determine information about the relative alignment between the first and second patterned structures based on the interference signal.

Embodiments of the system can include one or more of the following features and/or features of other aspects. For example, the information about the relative alignment includes an overlay error between the first patterned structure and the second patterned structure along a first direction. The system can be configured to derive a value of a signal from the interference signal, where the signal has a non-zero derivative with respect to the overlay error for a range of displacements of the first patterned structure relative to the second patterned structure along the first direction including a displacement corresponding to a zero overlay error. The overlay error can be a displacement of the first patterned structure from the second patterned structure along the first direction relative to a nominal position. The nominal position can correspond to a non-zero offset between the first and second patterned structures in the first direction. The nominal position can correspond to a zero-offset between the first and second patterned structures in the first direction.

The interferometer can define a pupil and the one or more optics can be configured to image the pupil onto the multi-element detector.

The system can include a polarizer positioned in a path of the test light prior to the overlay test pad and an analyzer positioned in the path of the test light after the overlay test pad. The transmission axes of the polarizer and analyzer can be parallel or non-parallel (e.g., orthogonal). In some embodiments, the system can include a waveplate positioned in a path of the test light.

The system can include a translation stage configured to adjust the relative optical path length between the test and reference light when they form the interference pattern. In some embodiments, the system includes a base for supporting a test object having the overlay test pad, and the translation stage can be configured to move at least a portion of the interferometer relative to the base. The system can include the common source, where the translation stage is configured to vary the optical path length over a range larger than a coherence length for the common source.

The first patterned structure can be a first grating. The second patterned structure can be a second grating. The first and second gratings can be in different layers of the overlay test pad.

The electronic processor can determine the information about the relative alignment based on optical modeling of the first and second patterned structures. In some embodiments, the electronic processor determines the information about the relative alignment based on differences between measurements taken on multiple test pads having known offset differences. In certain embodiments, the electronic processor determines the information about the relative alignment based on a combination of optical modeling and empirical data obtained from the interference signal.

The information about the relative alignment can include an overlay error between the first patterned structure and the second patterned structure along a first direction and an overlay error between the first patterned structure and the second patterned structure along a second direction different from the first direction.

The interferometer can include a beam splitter configured to separate input light derived from the common source into the test light and the reference light, and a reference surface positioned to reflect the reference light before it is combined with the test light. The interferometer can be configured so that the test light reflects from the overlay test pad, and the beam splitter in the interferometer can be positioned to recombine the test and reference light after they reflect from the respective test and reference surfaces.

The common source can be spatially extended. The can include the source, wherein the common source is a broadband source spanning more than 50 nm at full width half maximum.

In some embodiments, the interferometer and one or more optics are part of an interference microscope. The interference microscope can include a Mirau objective or a Linnik objective. The system can be part of a lithography tool. The electronic processor can be configured to account for tool-induced-shift when determining the information. In certain embodiments, the electronic processor is configured to account for wafer-induced-shift when determining the information.

In one aspect, the invention features a process for making a display panel, including providing a component of the display panel, the component supporting an overlay test pad, determining information about the overlay test pad using the system discussed above; and forming the display panel using the component based on the information about the overlay test pad. Implementations of the process can include one or more of the features of other aspects.

In one aspect, the invention features a process for making an integrated circuit, including providing a substrate comprising one or more integrated circuit structures, determining information about the one or more integrated circuit structures using the system discussed above, where the substrate includes the overlay test pad and the information is information about the overlay test pad, and forming the integrated circuit using the substrate based on the information. Implementations of the process can include one or more of the features of other aspects.

In one aspect, the invention features an interferometry method that includes directing test light to an overlay test pad, subsequently combining the test light with reference light to form an interference pattern on a multi-element detector so that different regions of the detector correspond to different illumination angles of the overlay test pad by the test light, wherein the test and reference light are derived from a common source and the overlay test pad comprises a first patterned structure and a second patterned structure, monitoring the interference pattern while varying an optical path difference between the test light and the reference light, and determining information about the relative alignment between the first and second patterned structures based on the interference pattern.

Implementations of the method can include one or more of the following features and/or features of other aspects. For example, the information about the relative alignment can include an overlay error between the first patterned structure and the second patterned structure along a first direction. Determining the information can include deriving a value of a signal from the interference pattern, where the signal has a non-zero derivative with respect to the overlay error for a range of displacements of the first patterned structure relative to the second patterned structure along the first direction including a displacement corresponding to a zero overlay error. The overlay error can be a displacement of the first patterned structure from the second patterned structure along the first direction relative to a nominal position. The nominal position can correspond to a non-zero offset between the first and second patterned structures in the first direction. The nominal position can correspond to a zero-offset between the first and second patterned structures in the first direction.

Determining the information can include determining a spatial frequency transform of the interference pattern. The transform can be a Fourier transform.

In some embodiments, the method is performed using an interference microscope. The method can be a low coherence interferometry method.

In another aspect, the invention features a process for making a display panel, including providing a component of the display panel, the component supporting an overlay test pad, determining information about the overlay test pad using the method discussed above; and forming the display panel using the component based on the information about the overlay test pad. Implementations of the method can include one or more of the features of other aspects.

In a further aspect, the invention features a process for making an integrated circuit, including providing a substrate having one or more integrated circuit structures, determining information about the one or more integrated circuit structures using the method discussed above, where the substrate comprises the overlay test pad and the information is information about the overlay test pad, and forming the integrated circuit using the substrate based on the information. Implementations of the method can include one or more of the features of other aspects.

Among other advantages, the methods and systems disclosed herein can provide accurate overlay measurements of relatively small target features (e.g., gratings having periods on the order of the wavelength of visible light or less, gratings that are underresolved by the apparatus used to make the measurement). The disclosed systems and methods can provide overlay measurements that are more accurate than overlay measurements made using non-interferometric techniques, for example.

As used herein, "light" is not limited to electromagnetic radiation in the visible spectral region, but rather refers generally to electromagnetic radiation in any of the ultraviolet, visible, near infrared, and infrared spectral regions.

Unless otherwise defined, all technical and scientific terms used herein have the same meaning as commonly understood by one of ordinary skill in the art to which this invention belongs. In case of conflict with any document incorporated by reference, the present disclosure controls.

Other features and advantages will be apparent from the following detailed description.

BRIEF DESCRIPTION OF THE DRAWINGS

FIG. 10(b) shows a portion of the plot shown in FIG. 10(a).

Like reference numerals in different drawings refer to common elements.

DETAILED DESCRIPTION

Figure 1:
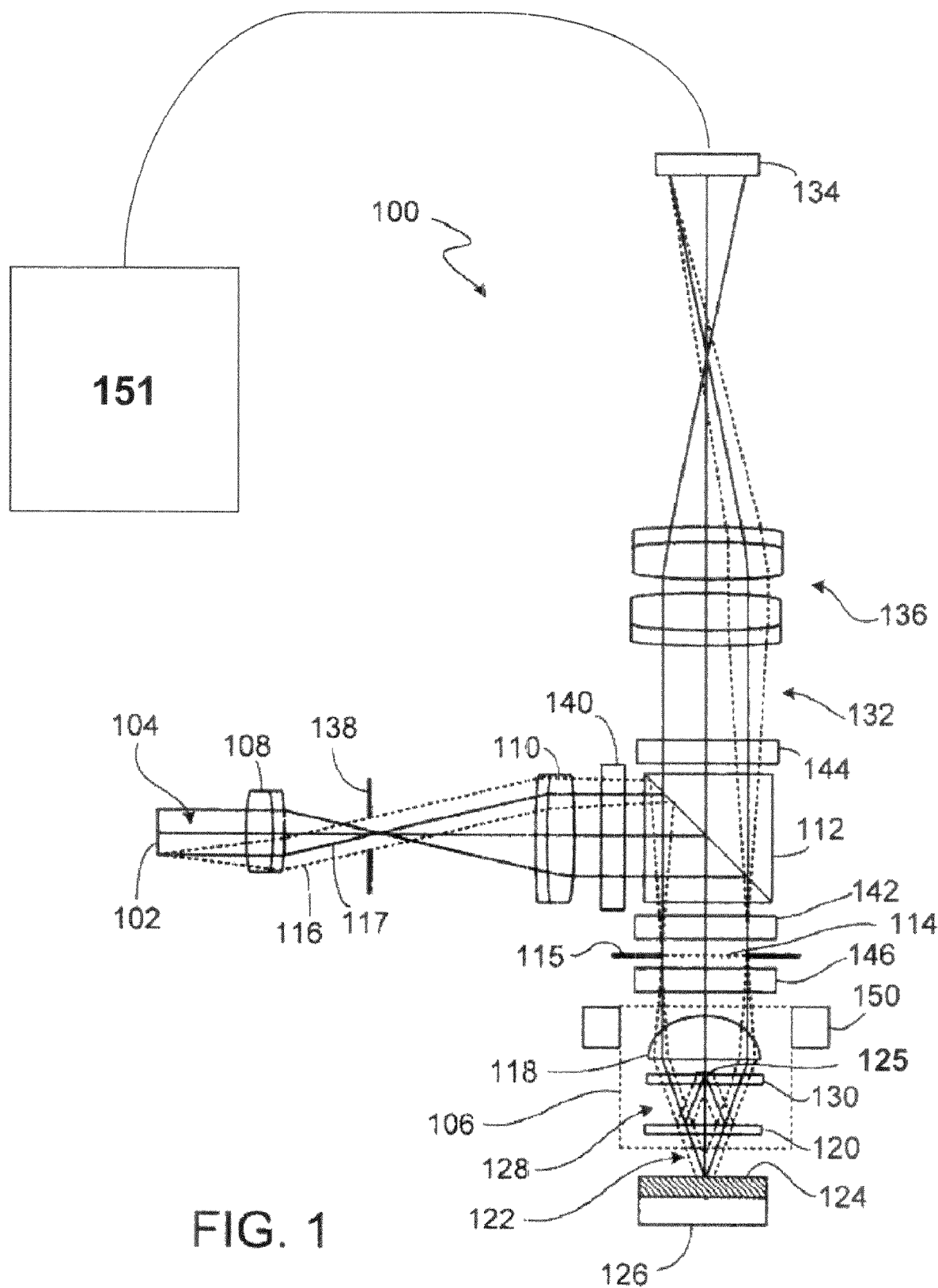
FIG. 1 is a schematic diagram of an embodiment of a PUPS interferometry system.

FIG. 1 is a schematic diagram of an interferometry system 100, of the type described in US Patent Publication No. 2006-0158659-A1 "INTERFEROMETER FOR DETERMINING CHARACTERISTICS OF AN OBJECT SURFACE" by Xavier Colonna de Lega et. al., US Patent Publication No. 2006-0158658-A "INTERFEROMETER WITH MULTIPLE MODES OF OPERATION FOR DETERMINING CHARACTERISTICS OF AN OBJECT SURFACE", by Xavier Colonna de Lega et. al., and US Patent Publication No. 2006-0158657 "A INTERFEROMETER FOR DETERMINING CHARACTERISTICS OF AN OBJECT SURFACE, INCLUDING PROCESSING AND CALIBRATION" by Xavier Colonna de Lega et. al., each of which is incorporated herein by reference.

A spatially extended source 102 directs input light 104 to an interference objective 106 via relay optics 108 and 110 and beam splitter 112. The relay optics 108 and 110 image input light 104 from spatially extended source 102 to an aperture stop 115 and corresponding pupil plane 114 of the interference objective 106 (as shown by the dotted marginal rays 116 and solid chief rays 117).

In the embodiment of FIG. 1, interference objective 106 is of the Mirau-type, including an objective lens 118, beam splitter 120, and reference surface 125. Beam splitter 120 separates input light 104 into test light 122, which is directed to a test surface 124 of a test object 126, and reference light 128, which reflects from reference surface 125 Objective lens 118 focuses the test and reference light to the test and reference surfaces, respectively. The reference optic 130 supporting reference surface 125 is coated to be reflective only for the focused reference light, so that the majority of the input light passes through the reference optic before being split by beam splitter 120.

After reflecting from the test and reference surfaces, the test and reference light are recombined by beam splitter 120 to form combined light 132, which is transmitted by beam splitter 112 and relay lens 136 to form an optical interference pattern on an electronic detector 134 (for example, a multi-element CCD or CMOS detector). The intensity profile of the optical interference pattern across the detector is measured by different elements of the detector and stored in an electronic processor (not shown) for analysis. Unlike a conventional profiling interferometer in which the test surface is imaged onto the detector, in the present embodiment, relay lens 136 (e.g., a Bertrand lens) images different points on the pupil plane 114 to corresponding points on detector 134 (again as illustrating by dotted marginal rays 116 and solid chief rays 117).

Because each source point illuminating pupil plane 114 creates a plane wave front for test light 122 illuminating test surface 124, the radial location of the source point in pupil plane 114 defines the angle of incidence of this illumination bundle with respect to the object normal. Thus, all source points located at a given distance from the optical axis correspond to a fixed angle of incidence, by which objective lens 118 focuses test light 122 to test surface 124. A field stop 138 positioned between relay optic 108 and 110 defines the area of test surface 124 illuminated by test light 122. After reflection from the test and reference surfaces, combined light 132 forms a secondary image of the source at pupil plane 114 of the objective lens. Because the combined light on the pupil plane is then re-imaged by relay lens 136 onto detector 134, the different elements of the detector 134 correspond to the different illumination angles of test light 122 on test surface 124.

In some embodiments, polarization elements 140, 142, 144, and 146 are optionally included to define the polarization state of the test and reference light being directed to the respective test and reference surfaces, and that of the combined light being directed to the detector. Depending on the embodiment, each polarization element can be a polarizer (e.g., a linear polarizer), a retardation plate (e.g., a half or quarter wave plate), or a similar optic that affects the polarization state of an incident beam. Furthermore, in some embodiments, one or more of the polarization elements can be absent. In some embodiment these elements are adjustable, for instance mounted on a rotation mount, and even motorized under electronic control of the system. Moreover, depending on the embodiment, beam splitter 112 can be polarizing beam splitter or a non-polarizing beam splitter. In general, because of the presence of polarization elements 140, 142 and/or 146, the state of polarization of test light 122 at test surface 124 can be a function of the azimuthal position of the light in pupil plane 114.

In the presently described embodiment, source 102 provides illumination over a broad band of wavelengths (e.g., an emission spectrum having a full-width, half-maximum of more than 50 nm, or preferably, even more than 100 nm). For example, source 102 can be a white light emitting diode (LED), a filament of a halogen bulb, an arc lamp such as a Xenon arc lamp or a so-called supercontinuum source that uses non-linear effects in optical materials to generate very broad source spectra (e.g., >200 nm). The broad band of wavelengths corresponds to a limited coherence length.

As in conventional scanning interferometer, a translation stage 150 adjusts the relative optic path length between the test and reference light to produce an optical interference signal at each of the detector elements. For example, in the embodiment of the FIG. 1, translation stage 150 is a piezoelectric transducer coupled to interference objective 106 to adjust the distance between the test surface and the interference objective, and thereby vary the relative optical path length between the test and reference light at the detector. The optical interference signals are recorded at detector 134 and processed by a computer 151 that is in communication with the detector.

The interference signal measured at each detector element is analyzed by the computer, which is electronically coupled to both detector 134 and translation stage 150. During analysis, computer 151 (or other electronic processor) determines the wavelength-dependent, complex reflectivity of the test surface from the interference signal. For example, the interference signal at each detector element can be Fourier transformed to give the magnitude and phase of the signal with respect to wavelength. This magnitude and phase can then be related to conventional ellipsometry parameters. The information (generally referred to herein as the "signal") is then used to determine an overlay error using the methodologies described below.

In overlay metrology, the parameter of interest is generally a relative displacement of a feature in a patterned layer relative to a feature in a preceding patterned layer along a direction. For example, referring to FIG. 2, this parameter is shown as the overlay error, c, between a patterned structure in a first layer 210 and a patterned structure in a second layer 220 overlying the first layer in the x-direction. Here, the structures in first and second layers 210 and 220 are gratings formed from grating lines 212 and 222, respectively. The gratings have the same period and are perfectly in phase for $\in = 0$.

Figure 2:
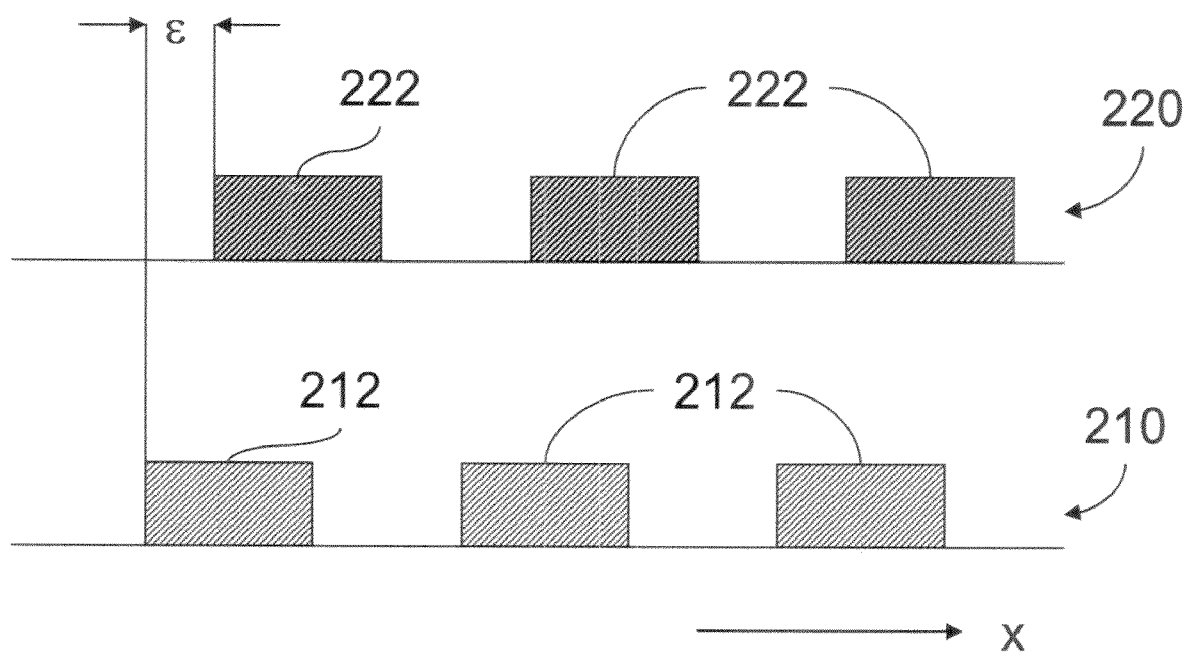
FIG. 2 is a cross-sectional view of a portion of an embodiment of a test pad for overlay measurements.

While the "test pad" structure shown in FIG. 2 is composed of two gratings having the same period, with one set on top of the other, in general a variety of test pad structures can be used. For example, the structured layers making up a test pad can be adjacent layers or can be separated by one or more intermediate layers. In some embodiments, two patterned layers of a test pad can be coplanar, such as in the context of double-exposure of a resist or double-patterning of an integrated circuit layer. Processing of the interference signals generated by the profiler determines the overlay registration of the patterned layers with respect to each other.

In certain embodiments, multiple patterned layers correspond to steps in a photolithography process. Patterning a resist layer in the process includes forming symmetric periodic structures (registration targets), either as a natural part of the photolithography process or specifically designed for the measurement. Examination of lateral asymmetry in the interference signals generated by the optical interferometric profiler reveals the overlay registration of the patterned layers with respect to each other.

Typically, PUPS overlay measurements are done with a linearly polarized light. Light entering the pupil is, for example, polarized orthogonal to the grating lines of the structure of interest (i.e., polarized parallel to the x-axis in FIG. 2). The light then reflects off the structure of interest (and the reference) and is analyzed using an analyzer oriented the same way as the polarizer in the illumination path. The choice of polarizer and analyzer orientations defines the functional relationship between the measured reflectivities and the four sample reflectivities $r_{pp}$, $r_{ps}$, $r_{sp}$, and $r_{ss}$ (to be thought of as the four Jones matrix components of the sample, where, e.g., is the complex field component in the S-direction after reflection of a P-polarized beam).

Figure 3:
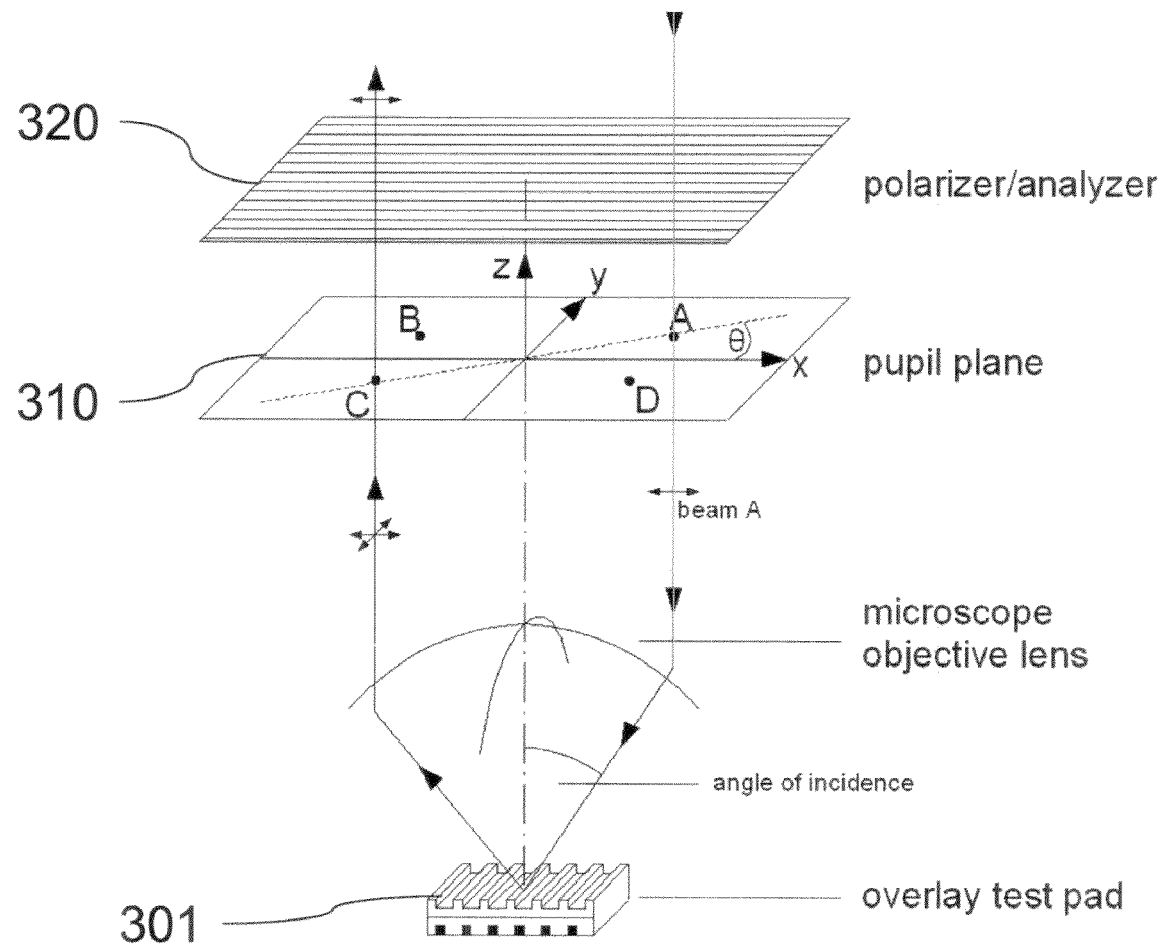
FIG. 3 is a schematic diagram showing illumination geometry in an embodiment of a PUPS interferometry system.

Referring to FIG. 3, symmetry considerations show that for a configuration where the polarizer and analyzer sample the same polarization state, the recorded signal is, to first order, insensitive to overlay changes about a nominally symmetric structure. This is believed to be true for whatever attribute of the measured reflectivities (e.g., magnitude, phase, phase and magnitude, real and imaginary part or intensity) is processed as 'signal' in the calculations. Specifically, FIG. 3 shows four points (i.e., A to D) in a pupil plane 310 that correspond to beams with the same wavelength and angle of incidence. These beams have the azimuthal incidence angles θ, 180°−θ, 180°+θ, and −θ, respectively, where the azimuth angle, θ, is measured with respect to the positive x-axis. Polarizer/analyzer 320 is also shown. The polarizer and analyzer orientations in the example are along the x-axis and the orientation of the grating lines is along the y-axis. The specular reflection of the originally linearly polarized beam A off an overlay test pad 301 comes back to pupil plane 310 at point C (opposite side). The analyzer filters the x-polarized component of the reflected beam.

The beams A and D result in identical reflectivities because they represent identical physical situations (one is the other mirrored at the x-z plane). The same is true for beams B and C. Less obviously, beams A and C or the beams B and D also result in identical specular reflectivities because the reciprocity theorem can be applied. Reciprocity may be expressed as follows: "The scattering amplitude for a b polarized scattered wave in the direction β arising from an a polarized incident wave in the direction a is equal to the amplitude for an a polarized scattered wave in the direction −a from a b polarized incident wave in the direction −β." See, e.g., R. J. Potton, "Recipricoty in Optics", *Rep. Prog. Phys.* 67 (2004) 717-754. The net effect is that the four beams A, B, C and D result in the same reflectivity, even in the presence of asymmetry of the structure being measured. Further, the same four reflectivities are obtained for a structure that is mirrored at the y-z plane (i.e., same physical situation, where beams A and D replace the beams B and C).

In the context of overlay measurements this means that the measurement is insensitive to the sign of the overlay. It also follows that the measured signals (e.g., reflectivities), if plotted as a functions of overlay, are even functions with zero slope for zero overlay error (assuming, of course, that the measured signal represents a continuous and differentiable function over the range of interest). Since the slope (e.g., partial derivative of the signal) is a measure for sensitivity to parameter changes, the measurement is insensitive to overlay for a nominally zero overlay.

In some embodiments, this zero-sensitivity situation can be avoided by intentionally offsetting the overlay between the two layers in a test pad. In other words, as shown in FIG. 2, a situation where $\in = 0$ would not correspond to the two layer's gratings being perfectly in phase. Rather, for $\in = 0$ there would still be a nominal, non-zero offset between the structures in layers 210 and 220. Due to the nominal offset, the slope of the PUPS signal is non-zero at that overlay offset value, which is now generally not zero. This non-zero slope determines the sensitivity to overlay. Overlay error can now be one of the parameters determined in a regression or library search.

In some embodiments, differential measurements can be used to determine overlay error. When using differential measurements, results are based on the difference between multiple measurements, each of a different test pad on a test object. Differential measurements can reduce (e.g., eliminate) various sources of uncertainty in an overlay measurement, e.g., the effect of signal biases which may be common to each of the measurements. With the appropriate choice of test pad design, one can also eliminate the need to simulate the light-sample interaction, which can be a computational burden or be error prone.

In general, it is believed that the following set of conditions should be fulfilled for differential measurements to work efficiently. Firstly, the measured quantity should be sensitive to the overlay error. Secondly, the measured quantity should have even or odd symmetry with respect to the overlay error. The measured quantity (as a function of the overlay error) should be parameterizable with a limited number of parameters (e.g., the coefficients of a low order polynomial). Finally, the number of test pads should be equal to or exceed the number of unknown coefficients of the parameterization of the measured quantity plus one ("plus one" because the unknown overlay error adds another unknown to the equations).

The first condition can be fulfilled by introducing relatively large nominal overlay offsets, ±d, between the layers of the patterned structures composing the test pads±d. For example, in some embodiments, the intentional offsets can be a significant fraction of the pitch of the test pad structures (e.g., about ⅛ pitch, about ¼ pitch, about ⅜ pitch).

The second condition, that the signal have odd or even symmetry, is generally met by the symmetry argument described above which says that the measurement signal S is insensitive to the sign of the overlay o.

$$S(o) = S(-o) \quad (1)$$

In certain embodiments, additional offsets±Δ are added to some of the nominal offsets±d in order to get a good sampling for the functional fit. In order to fulfill the third condition above, the magnitudes of those additional offsets are chosen from a relatively small range, e.g., 1/100 pitch, 1/50 pitch, 1/20 pitch or 1/10 pitch. Too small of a range, however, can lead to a low signal-to-noise ratio. A hybrid approach can also be used where a subset of parameters used in the signal parameterization is determined by means of optical modeling.

TABLE 1, below, shows possible sets of test pads with intentional overlay offsets that are shifted by the unknown overlay error $\in$. To reiterate, ±d is the nominal overlay offset built into each of the test pads. Δ is a built-in overlay variation designed into at least some of the test pads. Generally, $|\Delta| < |d|$. The symbolic measurement signals in the fourth column and the signal parameterizations in the fifth column (where o represents the overlay) are used to set up equation systems that can be solved to provide $\in$. The resulting formulas for $\in$ are shown in the last column.

TABLE 1

| Set No. | Test Pad No. | Nominal net test pad overlay offsets | Measurement Signals | Signal parameterization (in neighborhood of +d) | Resulting formula for the overlay error $\epsilon$ |
|---|---|---|---|---|---|
| 1 | 1 | d − Δ | $S_1 = S(d - \Delta + \epsilon)$ | S = ao + b | $\varepsilon = \frac{\Delta}{2} \cdot \frac{S_1 + S_2 - 2S_3}{-S_2 + S_1}$ |
|  | 2 | d + Δ | $S_2 = S(d + \Delta + \epsilon)$ |  |  |
|  | 3 | −d | $S_3 = S(-d + \varepsilon)$ $= S(d - \varepsilon)$ |  |  |
| 2 | 1 | d + Δ | $S_1 = S(d + \Delta + \epsilon)$ | $S = ao^2 + bo + c$ | $\varepsilon = \Delta \cdot \frac{S_1 + S_2 - S_3 - S_4}{S_1 - S_2 - S_3 + S_4}$ |
|  | 2 | d − Δ | $S_2 = S(d - \Delta + \epsilon)$ |  |  |
|  | 3 | −d + Δ | $S_3 = S(-d + \Delta + \epsilon)$ |  |  |
|  | 4 | −d − Δ | $S_4 = S(+d - \Delta - \epsilon)$ |  |  |
| 3 | 1 | Δ | $S_1 = S(d + \epsilon)$ | S = ao + b (with a determined with simulations) | $\varepsilon = \frac{1}{2a(S_1 - S_2)}$ |
|  | 2 | −d | $S_2 = S(-d + \varepsilon)$ $= S(+d - \varepsilon)$ |  |  |
| 4 | 1 | Δ | $S_1 = S(d - \Delta + \epsilon)$ | $S = ao^2 + bo + c$ (with a and b determined with simulations) | $\varepsilon = \frac{1}{(2b + 4ad)(S_1 - S_2)}$ |
|  | 2 | −d | $S_2 = S(d + \Delta + \epsilon)$ |  |  |

Figure 4:
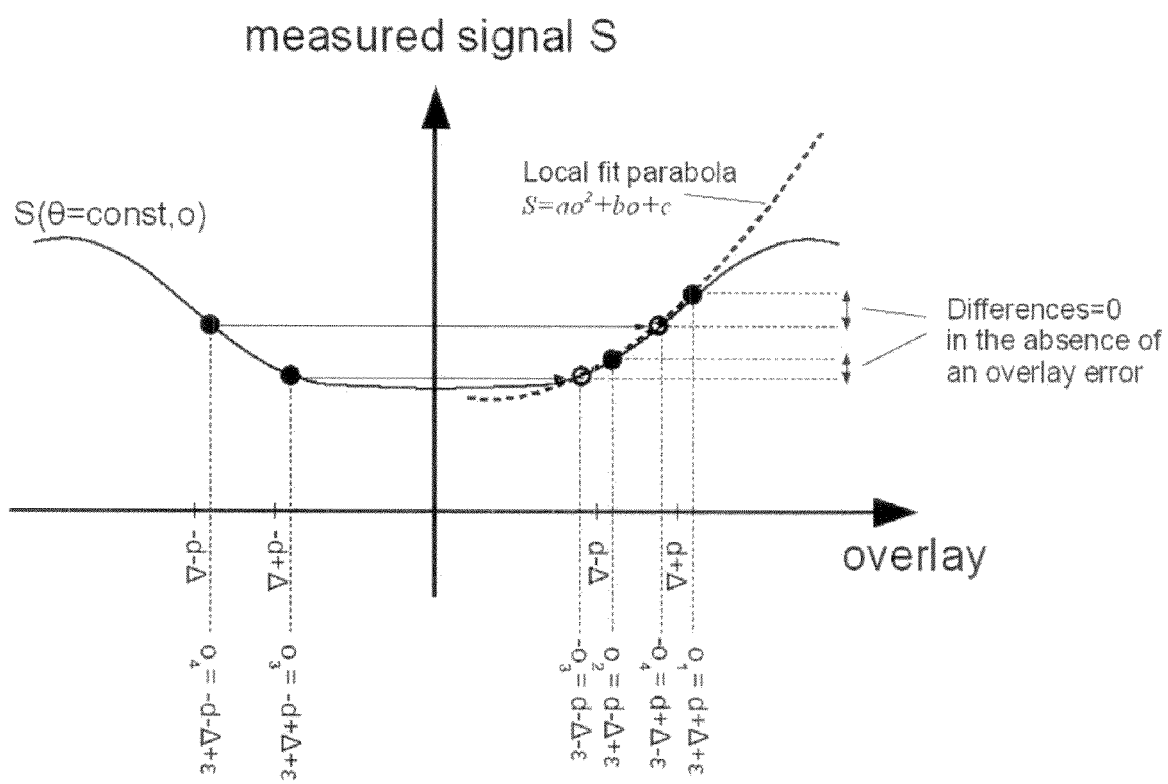
FIG. 4 is a plot showing the expected relationship between measured signal and overlay for certain embodiments.

A geometrical representation of the second case shown in TABLE 1 is shown in FIG. 4. Two of the four measured signals (solid dots) are duplicated (hollow dots) using the symmetry property represented by Equation 1. The signal in the neighborhood of o=d is approximated with a second order polynomial (having coefficients a, b and c). The four measurements allow for the determination of one additional parameter, the overlay error $\in$.

In some embodiments, the interferometry system itself can be configured to introduce the asymmetry necessary to make the signal sensitive to overlay errors. The reciprocity theorem mentioned above holds for PUPS system configurations where the polarizer in the illumination path represents the same polarization state as the analyzer in the imaging path. For the four beams A, B, C and D the reflectivity is identical. That symmetry is broken in a configuration in which the polarization state of the analyzer in the imaging leg ($P_{im}$) is different from the polarization state of the illumination ($P_{ill}$) seen by the opposite point in the pupil, i.e., $P_{im}(\theta) \neq P_{ill}(180° + \theta)$.

Figure 5:
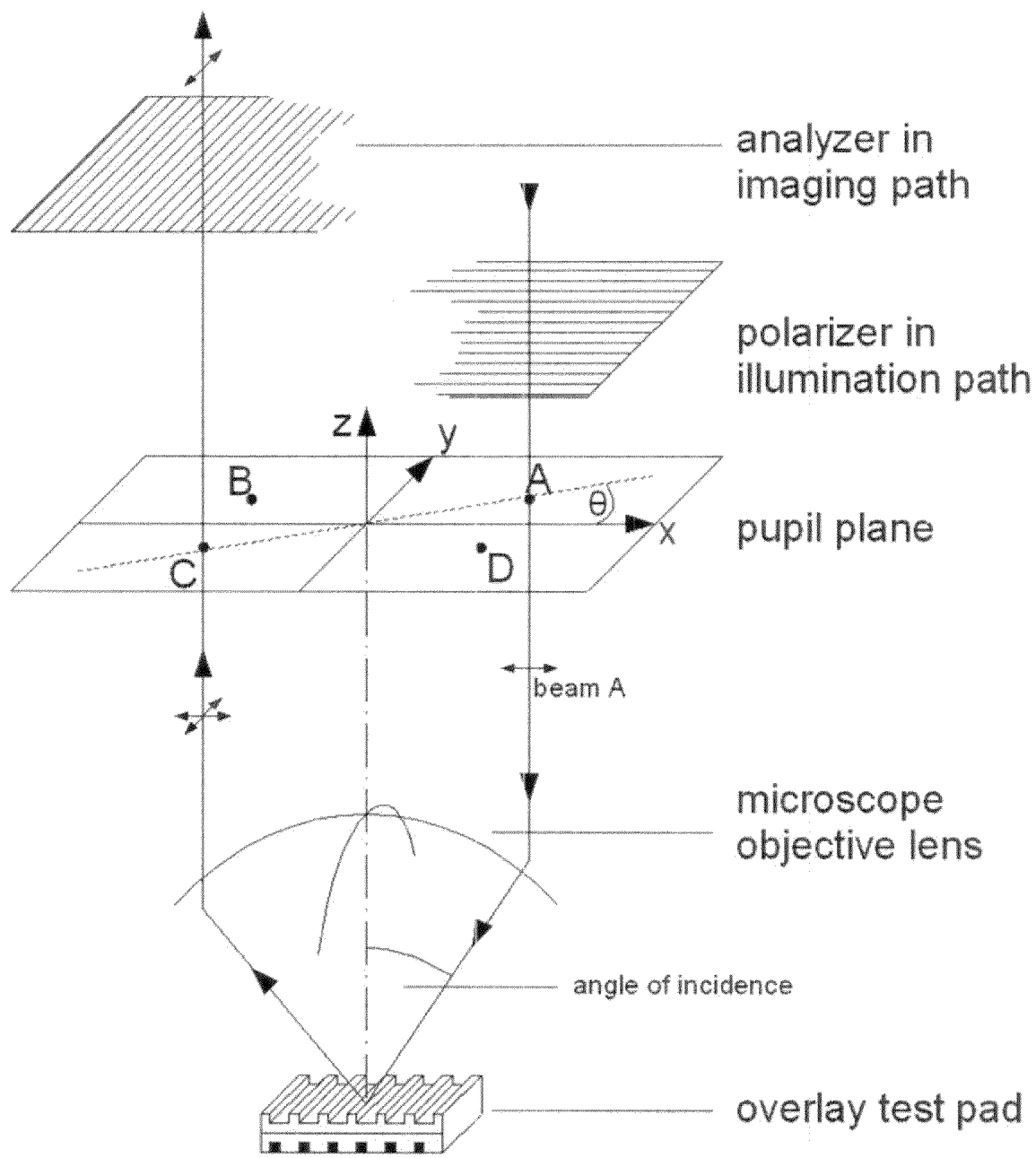
FIG. 5 is a schematic diagram showing illumination geometry in an embodiment of a PUPS interferometry system.

FIG. 5 shows a schematic view of such a system. In this arrangement, the reflectivities of beams A and C are generally different provided the object looked at is not symmetric with respect to the y-z plane. For test pads in which o=0 this condition is fulfilled. The same arguments hold for beams B and D. In general, for this configuration:

$$S(\theta, o) \neq S(\theta, -o) \quad (2)$$

Consequently, the partial derivative of the signal with respect to the overlay is generally non-zero around zero-overlay (i.e., o=0), which is a way of saying that the measurement is sensitive to overlay errors. Overlay can now be one of the parameters determined, for example, in a regression or a library search.

While a specific polarizer/analyzer configuration is shown in FIG. 5 (i.e., the polarizer is oriented with its pass axis parallel to the x-axis and the analyzer is oriented with its pass axis parallel to the y-axis), other combinations of polarizing elements in the illumination and imaging legs are possible. For example, in some embodiments, an illumination leg with a polarizer in the x-direction can be used followed by a quarter wave plate oriented with the fast axis oriented at 45° azimuth and the imaging leg using the same quarter wave plate that is now followed by a polarizer in the y-direction.

In some embodiments, the instrument is configured in a way such that a symmetric sample (e.g., zero overlay error and zero offset) yields a signal that has even symmetry with respect to the pupil center (i.e., $S(\theta, o=0)=S(180°+\theta, o=0)$). This way, any difference between the two complementary signals indicates an overlay error. In certain embodiments, the optical setup has a polarizer in the illumination path that is aligned with one of the coordinate axes (e.g., x or y) in FIG. 5 and an analyzer in the imaging path that is oriented orthogonal to the polarizer and hence aligned with the other coordinate axis. The even signal symmetry for zero overlay follows from the fact that the setup is physically identical under rotations by 180° about the optical axis. Here, as shown in FIG. 5, A becomes C (and vice versa) and B becomes D (and vice versa). The degree of asymmetry in the signal is a function of the overlay and vice versa. The degree of asymmetry can be defined mathematically as:

$$A(\theta,o)=S(\theta,o)-S(180°+\theta,o) \quad (3)$$

with $A(\theta, o=0)=0$ and $$A(\theta,o)=-A(\theta,-o) \quad (4)$$

Equation 4 can be explained considering Equation 3 and FIG. 5, where the signal measured at any pupil point for an overlay, o, for symmetry reasons is the same as the signal measured at the opposite pupil point for an overlay −o (i.e., 180° rotation about the z-axis).

In some embodiments, interferometry system 100 can include polarizing beam splitter (i.e., beamsplitter 112 is a polarizing beam splitter) and no further polarizers or wave plates. For example, beamsplitter 112 can include two regions having mutually orthogonal pass axes. Incoming light enters pupil plane 114 in one polarization state and has to undergo a polarization change in order not to be blocked by the polarizing beam splitter upon reflection from the test object. The structures on the overlay target generally cause a polarization change, the extent of which is structure dependent. For symmetry reasons, the polarization state of x or y polarized beams is not changed by the gratings if the azimuth angle is equal to 0° or 180° and therefore beams having those polarization states are blocked by the analyzer and do not contribute to an interference signal.

In some embodiments, two polarizers having differing orientations are positioned at or near pupil plane 114, each one being positioned in only part of the optical path in the interference microscope.

In some embodiments, similar optical asymmetry can be introduced by the interferometry system hardware where polarizer and analyzer are parallel to one another, for instance to characterize critical dimensions of a test structure. For example, this can be accomplished by introducing a set of polarizing elements between the polarizing beam splitter cube and the microscope objective. That set of polarizing elements may be, e.g., a quarter wave plate followed by a polarizer oriented at 0° or 90°, a half wave plate followed by a polarizer oriented at 0° or 90° or a polarizer oriented at 45° followed by a polarizer oriented at 0° or 90° (angles with respect to x axis in FIG. 5). The insertion/removal of these two elements can be motorized to allow rapid switching from a cross-polarizer to a parallel-polarizer configuration. Such arrangements can enable a single instrument to perform both CD and overlay measurements, for example.

In some embodiments, a dissimilar polarizer-analyzer configuration is realized by using a non-polarizing beam splitter cube, placing a polarizer in the illumination leg in front of the beam splitter cube and an analyzer in the imaging leg after the beam splitter cube. Similar to the previous configuration, this configuration allows switching between a regular PUPS setup (i.e., parallel polarizer and analyzer) and a dissimilar polarizer-analyzer configuration where the polarizer/analyzer orientation is controlled (e.g., by means of mechanical rotary stages or active polarization elements such as an electrically controlled LCD).

For an idealized Mirau objective, the polarization state of the reference beam would not change on its path through the objective. Consequently, in such a system, reference light is blocked by the polarizing beam splitter on the way to the camera preventing any interference signal. In practice, however, the reference light significantly changes its polarization state on its way through the objective (e.g., due to interaction with coated optics with optical power-beam splitter-reference mirror-beam splitter-coated optics with optical power). A portion of the reference light is therefore able to pass the polarizing beam splitter and is available for interference with the light coming from the overlay target. The polarization state of x or y polarized beams is not expected to change in the reference path if the azimuth angle of the polarization is equal to 0°, 90°, 180° or 270° and therefore those beams are blocked by the polarizing beam splitter. In some embodiments, homogeneity of the reference light across the pupil can be improved by including a polarization changing element in the reference path. For example, in some embodiments, a wave plate can be included in the reference path. Alternatively, or additionally, a structured reference mirror with grating lines oriented at 45° can be used.

While the interference microscope shown in FIG. 1 is a Mirau-type microscope, other types of microscope can also be used. For example, in some embodiments, a Linnik-type interference microscope can be used. In certain embodiments, a Linnik-type microscope can provide more flexibility for modulating polarization of the reference beam because the reference beam path is physically more accessible relative to a Mirau-type objective. A quarter-wave plate in the collimated space of the reference path, for example, can be provided to cause a rotation of the polarization in double-pass and therefore provide a completely illuminated pupil as seen by the camera. The use of a Linnik-type interference microscope can also allow adjusting the reference light intensity with respect to the test light intensity in order to maximize the fringe contrast. For example, a neutral density filter can be positioned in the path of the reference light to reduce its intensity as necessary.

Adjustment of the reference light intensity relative to the test light intensity can also be done with a polarized Mirau objective, e.g., in which the beam splitter is sandwiched between two quarter wave plates. In such configurations, the reference and test light have orthogonal polarization states. Placing an analyzer aligned with the reference light polarization (lighting the entire pupil) can cause the test light to experience a dissimilar polarizer/analyzer configuration.

As discussed previously, in some embodiments, differential measurements can be used to reduce or remove dependence on simulations in the measurement of the overlay. Differential measurements can be used in configurations that utilize dissimilar polarizer-analyzer alignments. The principle applied to, e.g., an orthogonal polarizer-analyzer configuration having Equation 4 fulfilled can enable a variety of overlay measurement schemes that use differential measurements. Examples of these schemes are summarized in TABLE 2, below. Compared to the configurations summarized in TABLE 1, large nominal offsets ±d are not necessary because sensitivity to overlay is given for zero overlay, where the quantity A (signal asymmetry) is parameterized. It is believed that this enables reducing the number of required test pads for the overlay measurement. TABLE 2 also shows one case (i.e., the last one in TABLE 2) that is assisted by modeling. This measurement is still a differential measurement since the quantity A itself is calculated by comparing two data points against each other.

multidimensional sets of data provided by PUPS type measurements that can cover ranges of wavelengths, angles of incidence and azimuth angles. This means that the formulas for c in the last columns of TABLE 1 and TABLE 2 are usually not applied to single values $S_1, S_2, \ldots$ or $A_1, A_2, \ldots$ but to sets of values that lead to a set of equations for ∈. The reported value for ∈ (i.e., the measured overlay error) can be the value that minimizes the overall error E in a least squares sense. For Equation 5 (which is the first example in TABLE 2), for example, a least square sum can be defined as $$E = \sum_{i=1}^{I} (\Delta N_i - \varepsilon D_i)^2 \qquad (6)$$

where I is the number of illumination parameter combinations (e.g., combinations of wavelengths, angle of incidence and azimuth angles) used, N is the numerator and D is the

TABLE 2

| Set No. | Test Pad No. | Nominal net test pad overlay offsets | Measurement Asymmetry | Asymmetry parameterization | Resulting formula for the overlay error ε |
|---|---|---|---|---|---|
| 1 | 1 | Δ | $A_1 = A(\Delta + \epsilon)$ | $A = ao$ | $\varepsilon = \Delta \cdot \dfrac{A_1 + A_2}{A_1 - A_2}$ |
|   | 2 | −Δ | $A_2 = A(-\Delta + \epsilon)$ |   |   |
| 2 | 1 | −Δ | $A_1 = A(-\Delta + \epsilon)$ | $A = ao^2 + bo$ | $\varepsilon = \Delta \cdot \dfrac{-3A_1 + 3A_3 \pm \sqrt{R}}{4A_1 - 8A_2 + 4A_3}$ |
|   |   |   |   |   | $R = A_1^2 + 64A_2^2 + A_3^2 -$ |
|   |   |   |   |   | $16A_1 A_2 - 16A_2 A_3 -$ |
|   |   |   |   |   | $34A_1 A_3$ |
|   | 2 | 0 | $A_2 = A(\epsilon)$ |   |   |
|   | 3 | Δ | $A_3 = A(\Delta + \epsilon)$ |   |   |
| 3 | 1 | Δ | $A_1 = A(\Delta + \epsilon)$ | $A = c\sin(2\pi o/p)$ p: stucture period | $\varepsilon = \arctan\left(\dfrac{A_1 + A_2}{A_1 - A_2}\tan\dfrac{2\pi\Delta}{p}\right) \cdot \dfrac{p}{2\pi}$ |
|   | 2 | −Δ | $A_2 = A(-\Delta + \epsilon)$ |   |   |
| 4 | 1 | 0 | $A_1 = A(\epsilon)$ | $A = ao$ (a determined with simulations) | $\varepsilon = \dfrac{A}{a}$ |

Figure 6:
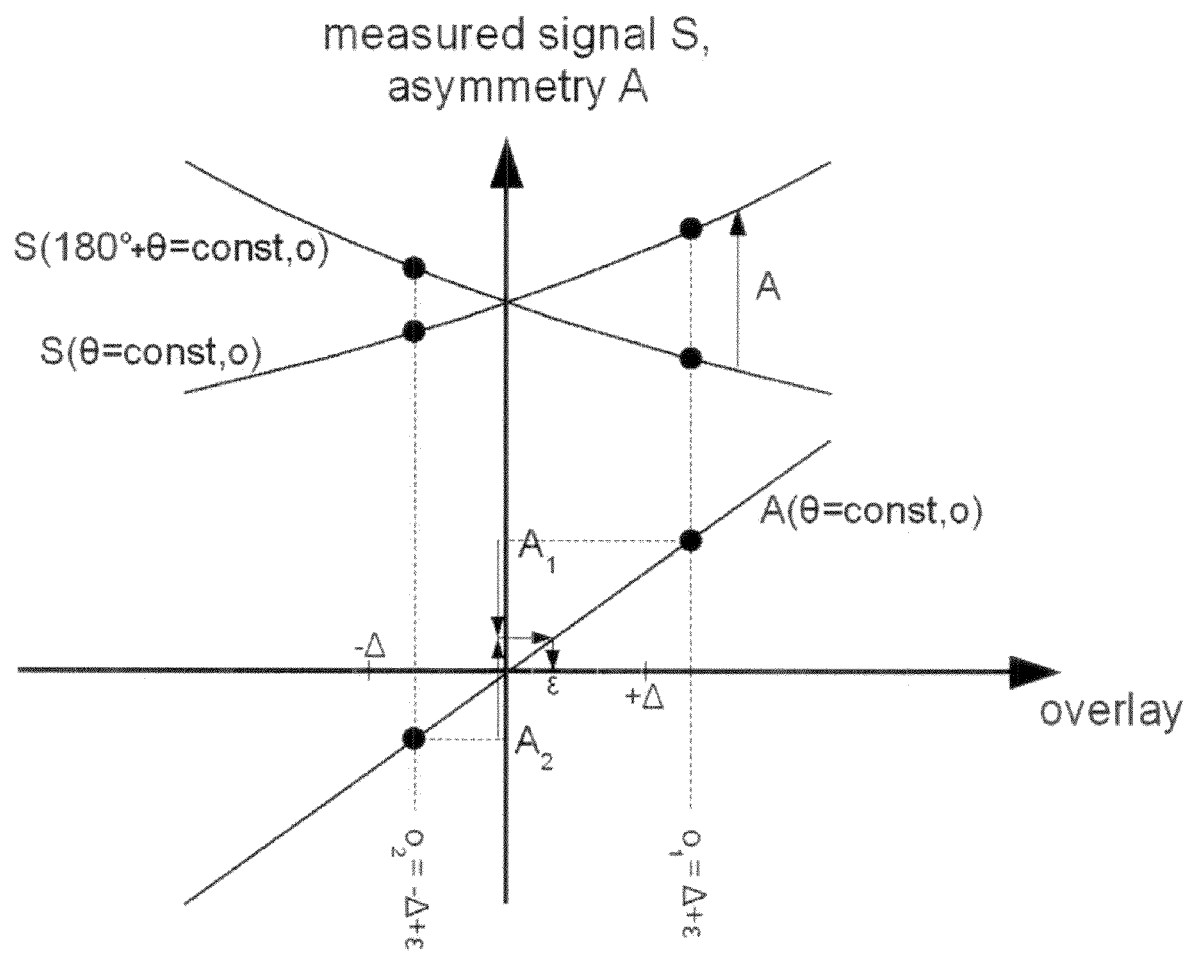
FIG. 6 is a plot showing the expected relationship between measured signal and overlay for certain embodiments.

FIG. 6 shows how the equation for the overlay error, e, in the first example in TABLE 2, $$\varepsilon = \Delta \cdot \frac{A_1 + A_2}{A_1 - A_2} \qquad (5)$$

is derived geometrically. Here, the top part of the plot shows possible measurement signals measured, for example, at the two pupil points A and C in FIG. 3. The asymmetry A is the difference between the two signal curves. Note that for a parabolic signal behavior, the asymmetry function is still linear. A, by definition, has a zero offset. The difference between the two asymmetry values defines the slope of A. With knowledge of the slope, the function A is completely determined and the mean of the two asymmetry values can be translated into the overlay error (in the absence of an overlay error the mean is zero).

For simplicity in the discussion above, the measurement quantities S and A are shown above as a function of the overlay, o, only. In fact, generally, these quantities represent denominator of the fraction in Equation 5. Mathematical tools, such as the singular value decomposition (SVD), may be used for the least squares minimization (see, e.g., "Numerical Recipes in C", 2nd edition, W. T. Vetterling et al., Cambridge University Press, 1992).

As an alternative to the least squares method, or in addition to it, a method similar to the one known as principal component analysis ("PCA") can be applied, which reveals the main trends in a multidimensional data set. (see, e.g., "Principal Component Analysis,", $2^{nd}$ edition, I. T. Lolliffe, Springer, New York, 2002). For example, PCA can be applied considering as a first dimension the numerator of the formulas for c and considering as a second dimension the denominator. PCA involves an eigenvector decomposition of the covariance matrix calculated for the numerator and denominator data (i.e., a 2×2 matrix). The ratio of the eigenvector components corresponding to the larger eigenvalue is reported as the collective result of the fraction term in the formulas. Ideally, when this method is applied, noise levels should be the same for the numerator and denominator. This is the case for the first example in TABLE 2, but not for the last example, where the denominator is simulated and therefore noise-free.

In general, any of the above methods may naturally benefit from a large number of data points in order to reduce the impact of measurement noise. With the test pad arrangements that don't require electromagnetic simulations (e.g., first and second example in TABLE 1 and first to third example in TABLE 2), using many data points may come at a relatively low computational cost. For the arrangements that use electromagnetic simulations for the determination of some of the coefficient of the signal parameterization (e.g., third and fourth example in TABLE 1 and fourth example in TABLE 2), computational efforts can be significant since the coefficients are different for all the combinations of wavelengths, angles of incidence and azimuth angles. In cases where the variation of the coefficients with wavelength, angle of incidence and azimuth angle is slow and continuous, it can be sufficient to calculate the coefficients for a discrete set of wavelengths, angles of incidence and azimuth angles and perform an interpolation for the values that were not explicitly calculated. Slow and continuous variations of the coefficients can be expected, e.g., for samples with optical thicknesses of the involved films smaller than half the shortest wavelength used, with a pitch smaller than the resolution limit of the microscope objective and with materials that don't have index abnormalities within the used spectral bandwidth. Since the coefficients of the parameterizations also depend on CD parameters of the structure (e.g., such as line widths, line heights, etc. . . . ), it can make sense to store coefficients in a library. In such embodiments, CD, film and material parameters can be determined with an independent measurement (e.g., a regular PUPS measurement using a parallel polarizer-analyzer configuration). The resulting CD, film and material parameters dictate which coefficients are to be retrieved from the library and consequently used for the signal parameterization in the overlay measurement.

In general, the processed signal, S, can be any attribute of the measured reflectivity including the magnitude and/or the phase of the complex reflectivity or the recorded intensity. In some embodiments, the magnitude and the phase (or equivalently the real and imaginary part) of the complex reflectivity can be used in the analysis. For example, where one seeks to extract as much information from the measurement as possible, magnitude and phase can be used. However, generally, PUPS type measurements can be accompanied with an unknown quantity which relates to an uncertainty in the positioning of the interference objective with respect to the sample. A shift of that position results in a shift of the interference signal when plotted as a function of the reference scan position. As a result, the complex reflectivities that are the result of a spectral analysis of the interference signal are phase-shifted by an unknown amount. Typically, the phase shift is a function of wavelength, angle of incidence and, of course, the position of the microscope objective with respect to the sample.

In general, this phase shift can be dealt with in a variety of ways depending on the measurement methodology used. For example, in embodiments in which asymmetries within the measurement apparatus are used (e.g., methods with dissimilar polarizer/analyzer orientation), the two signals $S(\theta)S(\theta)$ and $S(\theta+180°)$ that are used in Equation 3 for the calculation of asymmetry A are phase-shifted by the same amount $\phi$ since their corresponding wavelengths and angles of incidence are identical. They become $S(\theta)e^\phi$ and $S(\theta+180°)e^\phi$, respec tively. By redefining A, the influence of the unknown phase-shift is removed.

$$A(\theta) = (S(\theta)e^{i\varphi} - S(180° + \theta)e^{i\varphi})e^{-i \cdot arg(S(\theta)e^{i\varphi} - S(180°+\theta)e^{i\varphi})} \quad (7)$$
$$= (S(\theta) - S(180° + \theta))e^{-i \cdot arg(S(\theta)-S(180°+\theta))}$$

Here arg(x) denotes the phase of the complex number x. The mathematical operation corresponds to a rotation of signals $S(\theta)$ and $S(\theta+180°)$ so that their sum becomes purely real. Note that in the second line of Equation 7 the term $e^\phi$ is eliminated.

In methods that rely on comparisons of the same data point in different measurements (e.g., those differential measurements that use a parallel polarizer/analyzer configuration), the above approach is not applicable. Instead, each of the measurements m can be assigned a virtual microscope objective shift $\Delta z_m$ so that differences between the measurements are minimized. This is done, for example, by multiplying each of data points in a measurement with the complex term $e^{4\pi i \Delta z_m \cos(\alpha)/\lambda}$, where $\lambda$ is a wavelength of the light and cc is the angle of incidence. The modified data set can now used in formulas such as those shown in TABLE 1.

Figure 7:
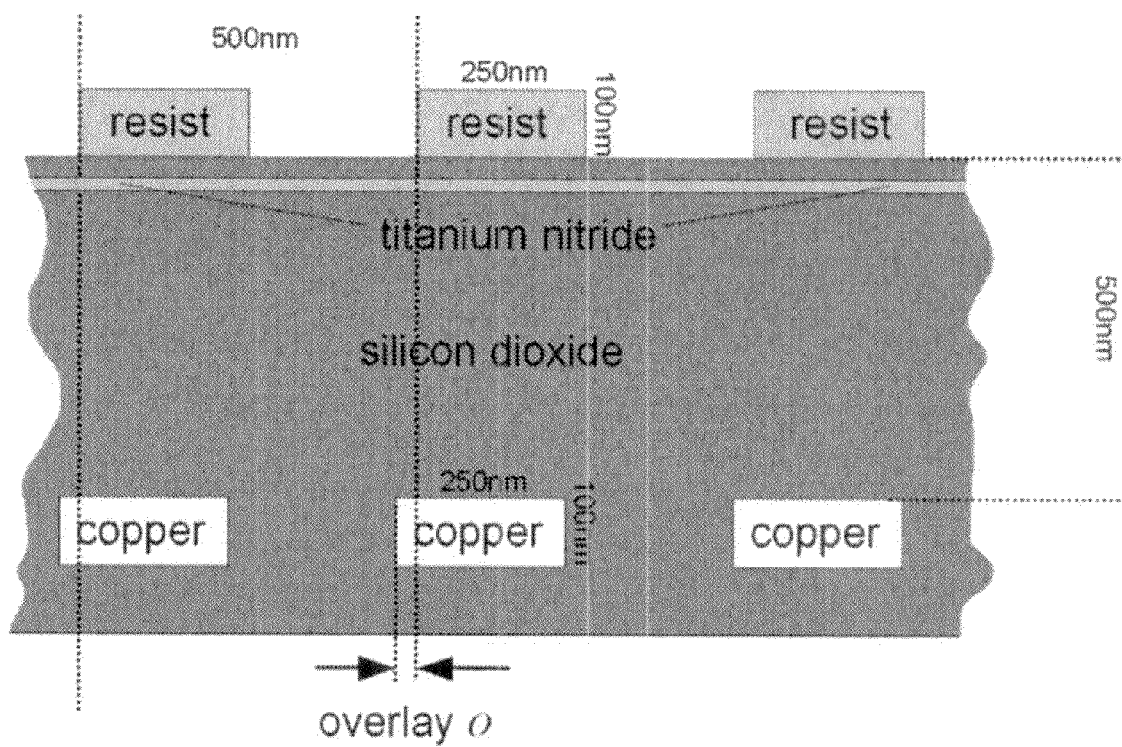
FIG. 7 is a cross-sectional view of an embodiment of an overlay test pad.

The effectiveness of PUPS overlay measurements can be studied by simulated example. For example, referring to FIG. 7, a simulated overlay target composed of a photo-resist grating on top of a copper grating has been studied. The two gratings are separated by 575 nm of a dielectric material (in this case, silicon dioxide) and a 25 nm titanium nitride layer representing an anti-reflection coating for the exposure UV light of a photolithographic process. The pitch of both the resist grating and the copper grating is 500 nm.

The complex reflectivities of the model structure were simulated for 425 different combinations of wavelengths (ranging from 450 nm to 650 nm), angles of incidence (ranging from 10° to 50°) and azimuth angles. Different polarizer/analyzer configurations of a PUPS setup were also explored, including configurations where both the polarizer and analyzer pass axes are parallel to the grating lines, configurations where both are orthogonal to the grating lines, and configurations where the polarizer is parallel to the grating lines but the analyzer is orthogonal to the grating lines. Simulations were run for overlays ranging from −250 nm to 250 nm (in 5 nm increments).

Figure 8:
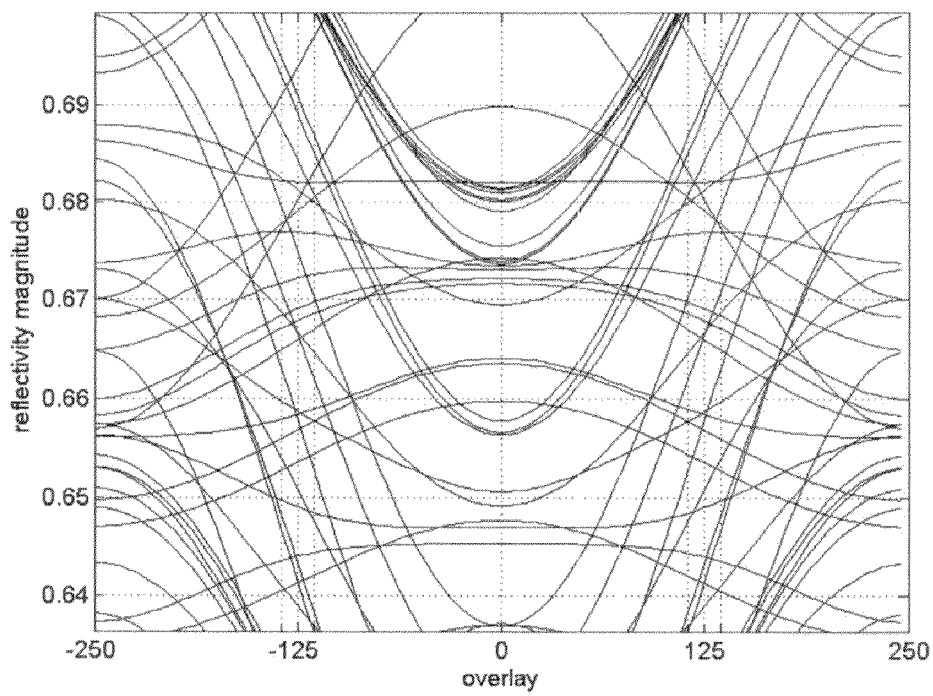
FIG. 8 is a plot showing simulated signals as a function of overlay.

FIG. 8 illustrates the behavior of the reflectivity magnitudes for the whole +/−250 nm overlay range for a configuration where polarizer and analyzer are parallel to the grating lines. Each line in the plot represents the reflectivity magnitude as a function of overlay for a specific wavelength and illumination angle. Due to the vast amount of data, only a section of the simulated data with intermediate signal strength is shown. As predicted, the signal has even symmetry, that is, reduced sensitivity to small overlay errors. For theses simulations, reasonable sensitivity to overlay requires large intentional overlay offsets. Marked with dashed lines around +/−125 nm overlay (d=125 nm), the plot shows the two 20 nm overlay ranges ($\Delta$=10 nm) in which the signals are parameterized as a linear function (e.g., first and third example in TABLE 1) or as a quadratic function (e.g., second and fourth example in TABLE 1).

Figure 9:
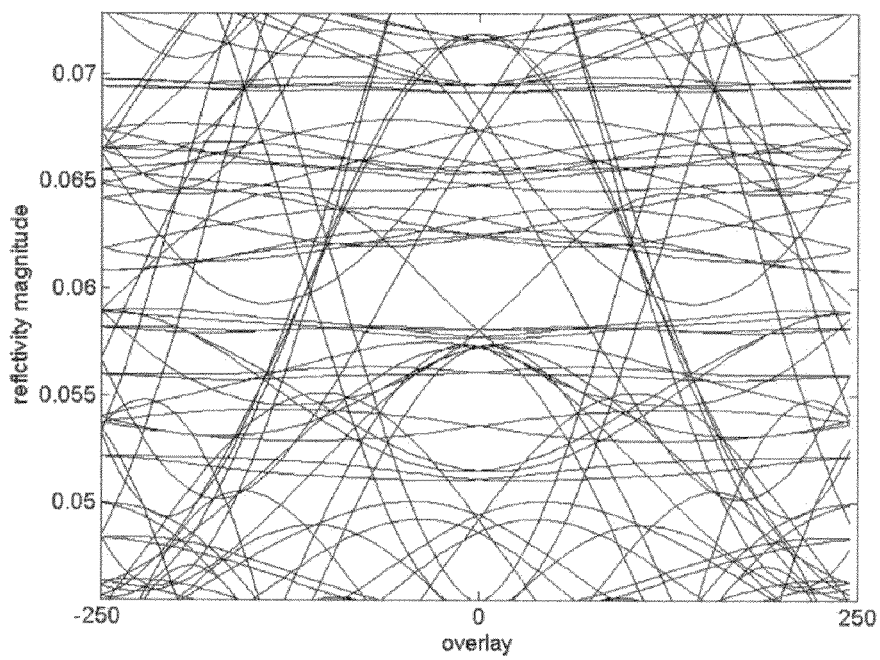
FIG. 9 is a plot showing simulated signals as a function of overlay.
Figure 10:
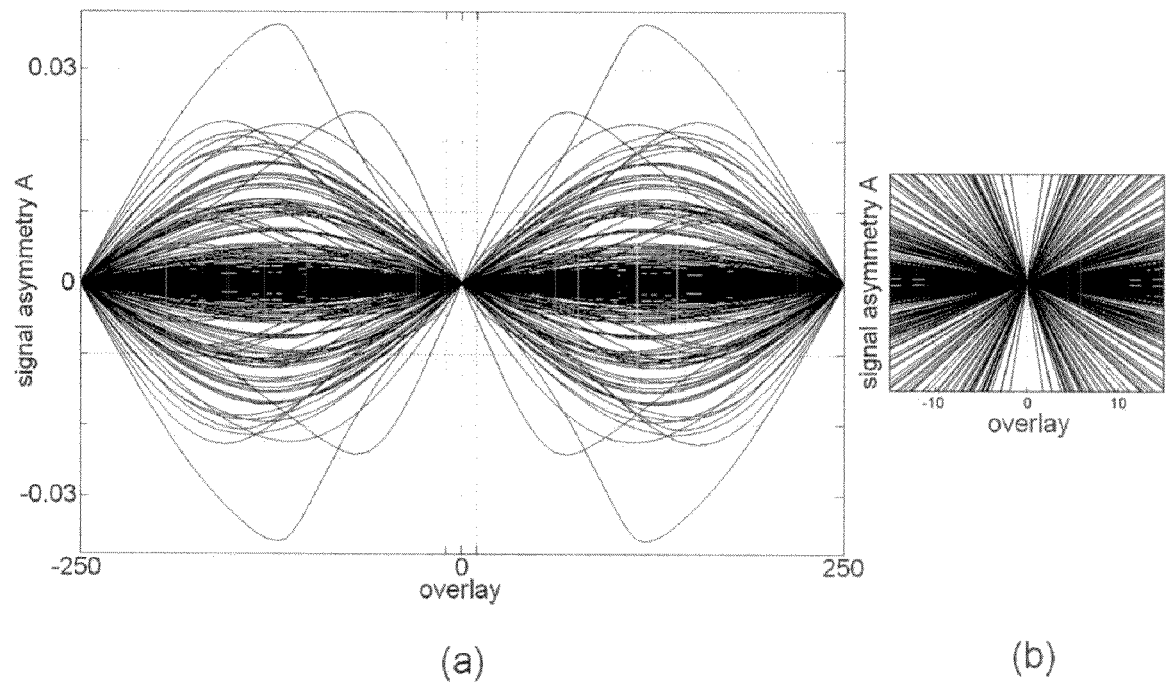
FIGS. 10(a) and 10(b) are plots showing simulated signal asymmetry as a function of overlay.

FIG. 9 illustrates the behavior of the reflectivity magnitudes for the whole +/−250 nm overlay range for a configuration where polarizer and analyzer are orthogonal and parallel to the grating lines, respectively. As predicted, sensitivity to overlay is given for zero overlay. Using Equation 3, the degree of asymmetry of the signal A can be calculated. FIG. 10(a) illustrates the odd symmetry of A around zero overlay. The first parameterization in TABLE 2 assumes a linear behavior of A in the range of intentional overlay offsets. FIG. 10(b) is a detail view of the quantity A for the central 30 nm overlay range. Linear approximations of A in that range appear reasonable.

Using all available data (also the ones with low sensitivity) and the error sum minimization according to Equation 6, the overlay error is determined. Results for the various signal parameterizations are shown in TABLE 3. It is a test case where the actual (simulated) overlay error is 1 nm.

Based on the simulated results, the five methods summarized in TABLE 3 have similar performance in the absence of noise. Generally, minor errors in the determination of the overlay error can be attributed to imperfect signal parameterizations (e.g., contributions from higher order polynomials in the signal). In order to get a sense for the repeatability, statistical noise was added to the simulated signals and the overlay error was calculated repeatedly (1,000 times). For these simulations, the repeatability figures turned out to be lowest for the approach with crossed polarizers. A noise level equivalent to 0.1% of the mean signal was applied. Note that for the crossed-polarizer approach, the degree of extinction by the analyzer is typically significantly higher than for a parallel-polarizer approach (to be able to achieve a comparable relative noise level). Accordingly, a higher intensity light source may be implemented to address the higher degree of extinction.

Figure 11:
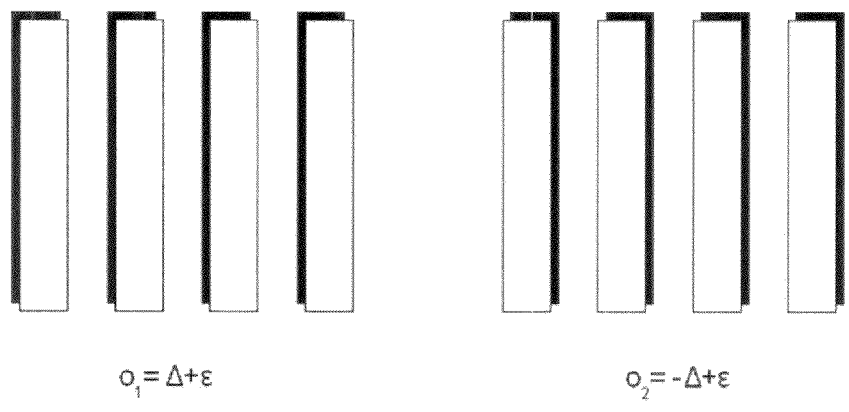
FIG. 11 is a diagram showing a pair of test pads for overlay measurement.

The procedures described above can be used to determine the overlay error in one dimension using varying numbers of measurement pads (e.g., between 1 and 4 mentioned, or more) partly having built-in nominal overlay offsets. The multiple test pads can be arranged in vicinity of each other on a wafer or spread out over the wafer. As an example, FIG. 11 shows a simplified top view of two overlay test pads with opposite nominal offsets. In this example, overlay is determined in a direction orthogonal to the lines.

Figure 12:
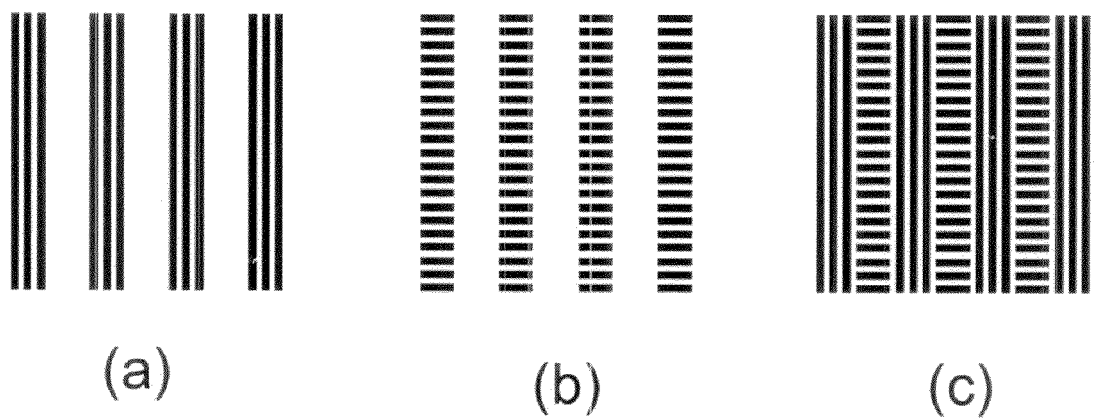
FIGS. 12(a)-12(c) show three different test pad arrangements for overlay measurement.
Figure 13:
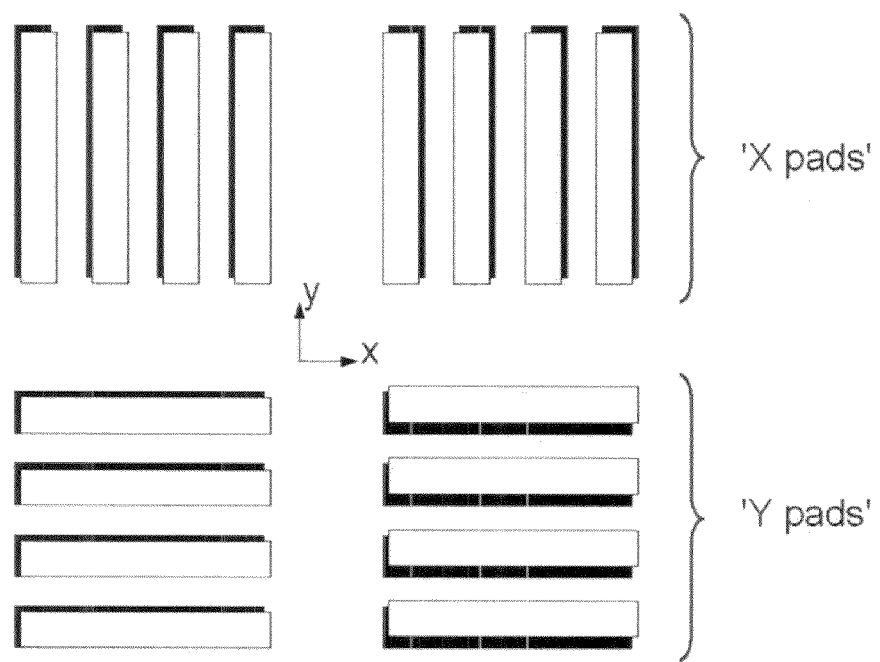
FIG. 13 is a diagram showing an arrangement of four test pads for overlay measurement.

In some embodiments, test pads features structures of differing size. For example, design rules (e.g., for feature densities or CDs) may require that the solid lines of the top layer, the underlying layer, or both layers be subdivided into lines of smaller dimensions. Examples of such configurations are shown in FIGS. 12(a)-12(c). The design shown in FIG. 12(c), for example, has identical material densities in the line areas and between the lines. Polarized light, however, can distinguish between the two substructure orientations. While the foregoing discussion relates to measuring overlay in a single dimension, in general, the techniques can be extended to measuring overlay in more than one dimension. For example, it is possible to determine the overlay in two directions by having twice the number of test pads of whatever method is preferred, with a first set being arranged to measure overlay in a first direction, and a second set arranged to measure overlay in a second direction. As an example, FIG. 13 shows a possible arrangement of 2×2 test pads, two for the x-direction and two for the y-direction.

TABLE 3

| | |
|---|---|
| Actual overlay error ϵ used for simulation | 1.00 nm |
| Calculated overlay error ϵ using crossed polarizers, 2 test pads and a linear parameterization of signal asymmetries (first signal parameterization example in table 2) | 0.995 nm |
| 1σ repeatability with 0.1% signal noise (relative to mean signal) | 0.014 nm |
| Calculated overlay error ϵ with polarizer and analyzer oriented parallel to grating lines, 3 test pads and a linear parameterization of the signals (first signal parameterization example in table 1) | 1.005 nm |
| 1σ repeatability with 0.1% signal noise (relative to mean signal) | 0.053 nm |
| Calculated overlay error ϵ with polarizer and analyzer oriented orthogonal to grating lines, 3 test pads and a linear parameterization of the signals (first signal parameterization example in table 1) | 0.992 nm |
| 1σ repeatability with 0.1% signal noise (relative to mean signal) | 0.071 nm |
| Calculated overlay error ϵ with polarizer and analyzer oriented parallel to grating lines, 3 test pads and a parabolic parameterization of the signals (second signal parameterization example in table 1) | 0.995 nm |
| 1σ repeatability with 0.1% signal noise (relative to mean signal) | 0.045 nm |
| Calculated overlay error ϵ with polarizer and analyzer oriented orthogonal to grating lines, 4 test pads and a parabolic parameterization of the signals (first signal parameterization example in table 1) | 0.995 nm |
| 1σ repeatability with 0.1% signal noise (relative to mean signal) | 0.058 nm |

In general, a variety of different test pad designs and layouts can be used. Typically, as shown in FIG. 2, for example, test pads feature layers having periodic structures, having period $\Lambda$. In general, $\Lambda$ will be in a range from $0.1\lambda$ to about $2\lambda$ (e.g., from $0.5\lambda$ to $1.5\lambda$, such as about $\lambda$), where $\lambda$ is the peak wavelength of the interferometry system light source. $\Lambda$ can be in a range from about 20 nm to about 1,000 nm (e.g., about 50 nm or more, about 100 nm or more, about 200 nm or more, about 400 nm or more, about 800 nm or less, about 600 nm or less). The target patterns can be formed from materials such as photoresists, dielectric materials, metals and/or semiconductors. Overlay test pad pattern layers can be made of the same or different materials as other patterned layers.

Alternatively, or additionally, test pads can be designed to be sensitive to overlay in two directions. For example, FIG. 14 schematically shows a pair of test pads with opposite nominal overlay offsets that can be used to determine overlay in two directions (e.g., using the crossed polarizer approach).

Figure 14:
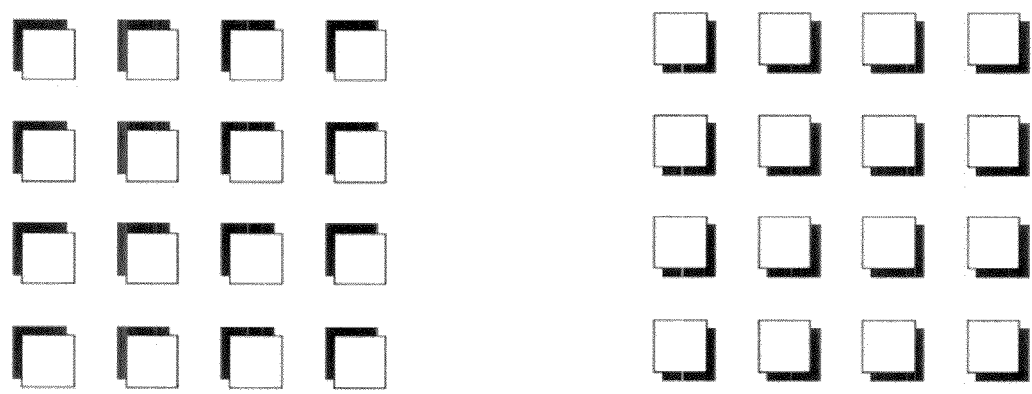
FIG. 14 is a diagram showing a pair of test pads for overlay measurement.

In some embodiments, it is sufficient to use only one of the test pads shown in FIG. 14 to determine overlay in the two directions. For example, where a dissimilar polarizer/analyzer configuration is used (e.g., without intentional offset), a single test pad can be used if complete modeling of the optical response for the orthogonal polarizer-analyzer configuration is an option. Alternatively, or additionally, if a differential method is desired, the equations in TABLE 2 can be evaluated for the x and y directions, separately. Here, $\Delta$, $\epsilon$ and A are substituted by $\Delta_x$ and $\Delta_y$, $\in_x$ and $\in_y$, and $A_x$ and $A_y$, respectively, where $A_x$ is calculated as $$A_x(\theta,o) = S(\theta,o) - S(180°-\theta,o) \quad (8)$$

and $A_y$ becomes $$A_y(\theta,o) = S(180°+\theta,o) - S(180°-\theta,o) \quad (9)$$

Note that the number of required test pads has not changed compared to measuring the overlay in only one dimension, i.e., it takes only two test pads and no simulations to determine overlay in two dimensions.

Using a parallel polarizer/analyzer configuration, the determination of overlay in two dimensions may require additional test pads because asymmetries are evaluated between measurements on different test pads, not within measurements.

Figure 15:
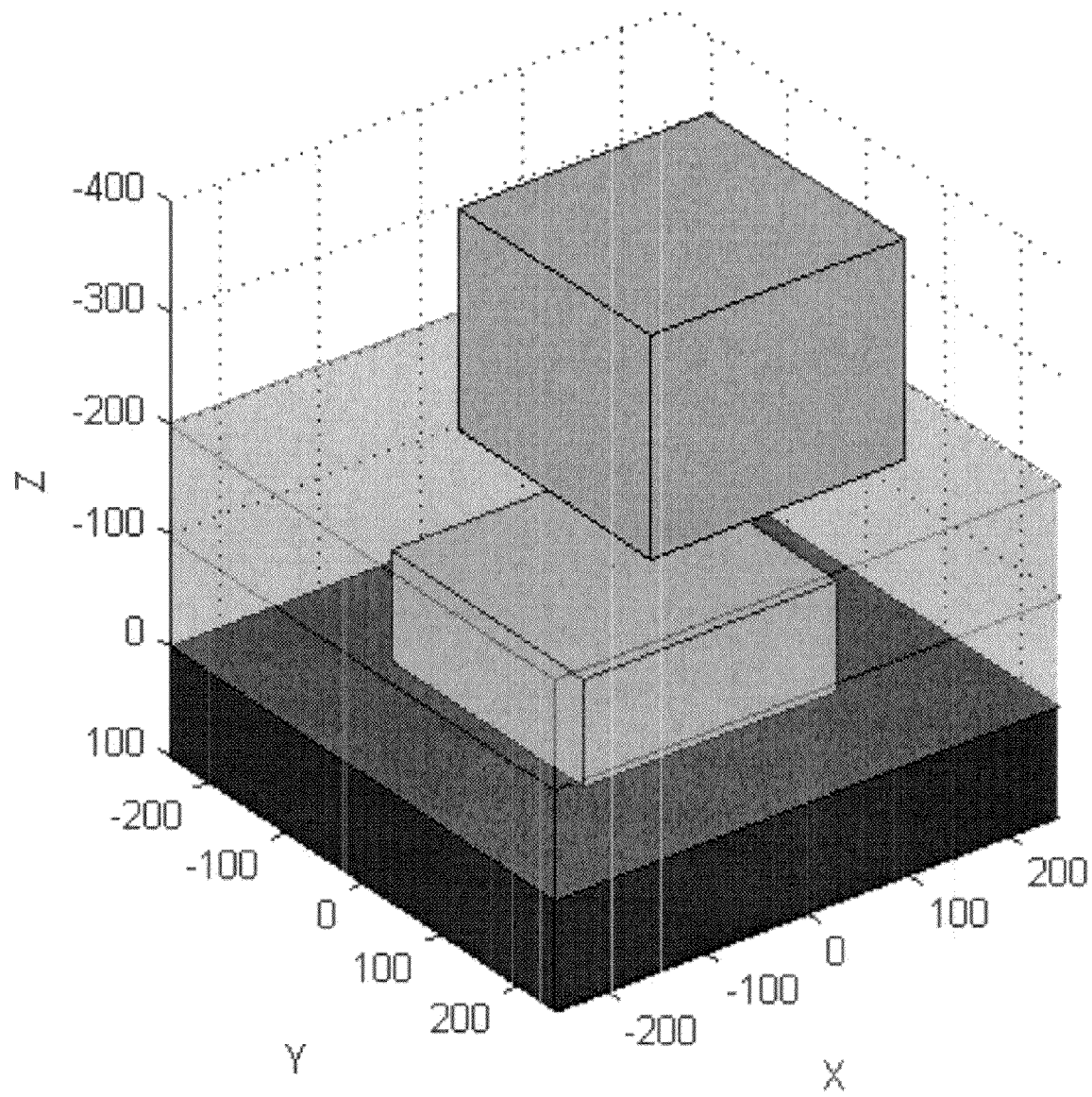
FIG. 15 is a diagram showing a unit cell of a test pad for overlay measurement.

In order to demonstrate the behavior of signal symmetries as a function of the overlay in x and y, the optical response of an example structure was simulated using a RCWA (rigorous coupled-wave analysis) method. FIG. 15 shows the example structure that was used for the simulations. Only one unit cell is shown, i.e., the structure repeats in the x and y directions to form a grating that is periodic in two dimensions. The structure is a 500 nm×500 nm unit cell with a resist feature above a copper feature buried in a dielectric (silicon oxide). The substrate material is silicon. Overlay offsets of the resist feature in x and y are freely adjustable.

Figure 16:
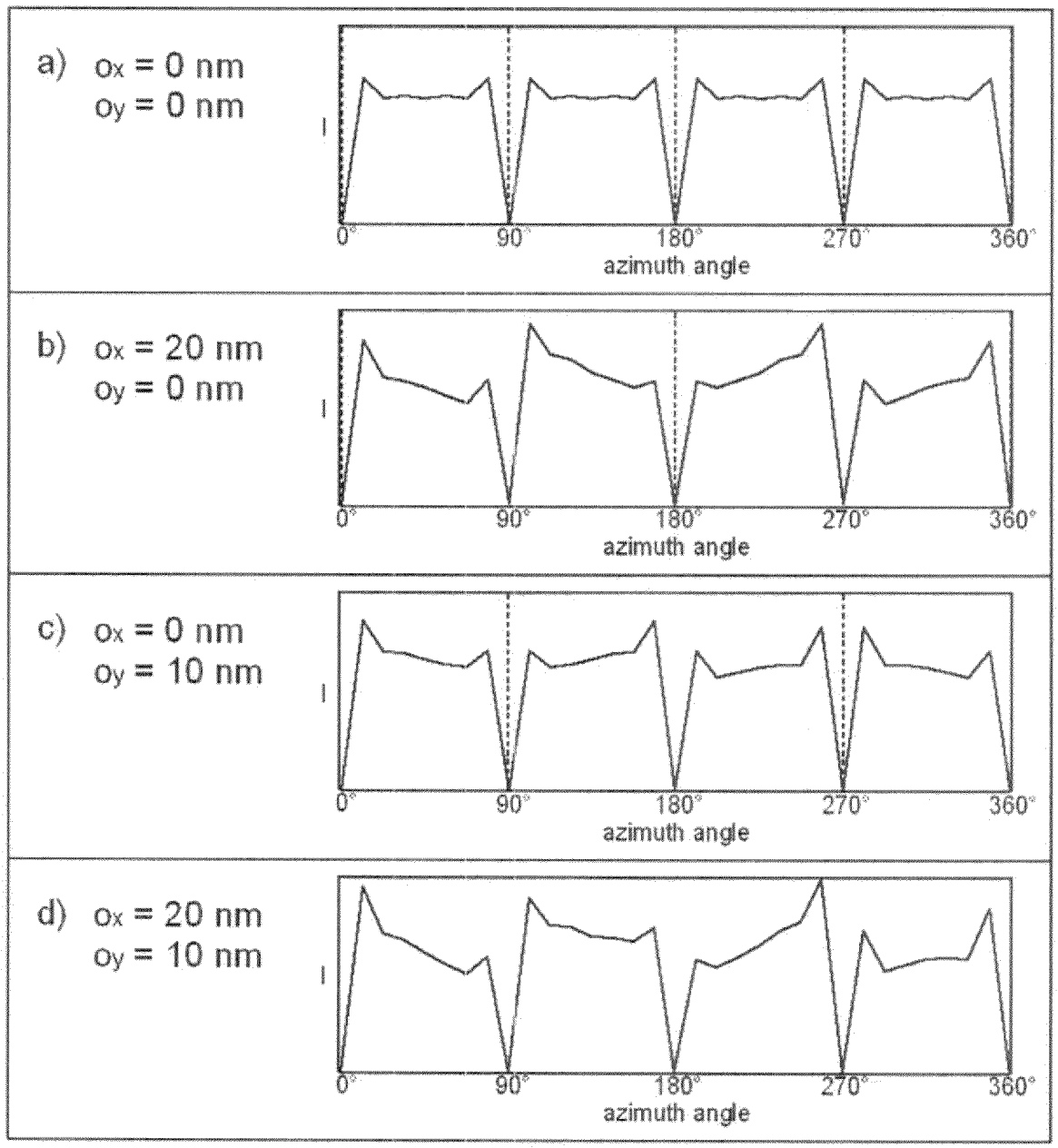
FIGS. 16(a)-16(d) show plots of simulated reflected intensities as a function of azimuthal angle of incidence for an exemplary test pad structure in four different arrangements. The signal was simulated for a wavelength of 450 nm and a polar incidence angle of 46°.

FIGS. 16(a)-16(d) show the simulated intensity of the specular reflection for a set of four different overlay cases as a function of the azimuth angle with the wavelength and angle of incidence kept constant. Each plot uses a single wavelength (450 nm), a single angle of incidence (46°), and the whole 360° range of azimuth angles. Dashed lines indicate the angles with respect to which the signal is symmetric. The overlay for each plot is as follows: FIG. 16(a) overlay=0 in both x and y. FIG. 16(b) overlay=0 only in y. FIG. 16(c) overlay=0 only in x. FIG. 16(d) overlay≠0 in both x and y. As an alternative, or in addition, to intensity, one could plot amplitude, phase, real part, imaginary part of the signal, which would all reflect the same symmetries.

In FIG. 16(a), the signal has even symmetry with respect to azimuth angles 0°, 90°, 180° and 270°, i.e., for arbitrary azimuth angles, both Equation 7 and Equation 8 result in zero, indicating zero overlay in x and in y. By introducing a non-zero overlay in FIG. 16(b), the signal loses part of its symmetry. Even symmetry with respect to azimuth angles 0° and 180°, however, is conserved and leads to a vanishing signal asymmetry $A_y$ in Equation 8. The opposite is true for FIG. 16(c), where there is an overlay shift only in y. In FIG. 16(d), the symmetry is completely broken by having overlay in both x and in y.

The described differential methods for overlay measurement are based on the assumption that the measured quantity as a function of overlay is symmetric (e.g., either even or odd symmetry). Thus, any symmetry-breaking distortion of the measured quantity not caused by the overlay can bias the outcome of the overlay measurement. Tool-induced shift (TIS) and Wafer-induced shift (WIS) are two classes of causes that can be responsible for such symmetry breaks. TIS can be caused by uncalibrated asymmetric optical system responses (e.g., due to misaligned optics and/or material heterogeneities such as birefringence) and WIS can arise from asymmetries in the features that form the overlay target (e.g., a tilted feature top surface).

In some embodiments, TIS can be addressed in overlay metrology by repeating measurements after rotation of the wafer by 180°. The results are then averaged or a new equation system is set up which includes the results of all measurements. To give an example how this second measurement can be used to eliminate the effect of TIS, refer to the first example in TABLE 2. Here, TIS is added as an offset term in the parameterization of the signal asymmetry A. Having additional information from the second set of measurements (e.g., four measurements altogether) makes the determination of that offset plus an additional polynomial coefficient (e.g., quadratic term) possible. See, e.g., TABLE 4, below, which shows formulas for overlay error and TIS based on certain asymmetric parameterizations. Here, it is assumed that a pair of test pads with intentional overlay offsets $\Delta$, are used, that are further shifted by the unknown overlay error $\in$. The pads are measured twice (once in one wafer orientation and once after 180° wafer rotation), leading to four values for the quantity A. Formulas for the overlay error and TIS are given in the rightmost column.

TABLE 4

| Test Pad No. | Nominal overlay offset | Measured Signal Asymmetry | Asymmetry parameterization | Resulting formula for the overlay error $\in$ |
|---|---|---|---|---|
| 1 | $\Delta$ | $A_{1,0°} = A(\Delta + \in)$ $A_{1,180°} = A(-\Delta - \in)$ | $A = ao^2 + bo + TIS$ | $\in = D \times \dfrac{A_{1,0°} + A_{2,0°} + A_{1,180°} + A_{2,180°}}{A_{1,0°} - A_{2,0°} + A_{1,180°} - A_{2,180°}}$ |
| 2 | $-\Delta$ | $A_{2,0°} = A(-\Delta + \in)$ $A_{2,180°} = A(-\Delta + \in)$ | | $TIS = D \times \dfrac{A_{1,0°} + A_{2,0°} + A_{1,180°} + A_{2,180°}}{4}$ |

For some applications, it may be sufficient to determine TIS with only one pair of measurement pads using the described procedure. For subsequent measurements at other test pad sites or on other wafers, the TIS is subtracted from the quantities A before the overlay error is calculated using only one wafer orientation. A predetermined TIS can be used where the test pad structures are very similar because, generally, the TIS will have different magnitudes for differing structures. It may be necessary to determine TIS after a change of the semiconductor manufacturing process (e.g., after a change in refractive indices or feature dimensions) or a change of the instrument environment (e.g., temperature, pressure, humidity).

In embodiments that utilize modeling of the light-sample interaction and of the effect of instrument properties, TIS effects can be included in the simulations. This may require characterizing the instrument in the simulation.

It is believed that among the two general approaches introduced for making PUPS measurements sensitive to overlay, the approach that uses large predetermined overlay offsets (e.g., in a regular PUPS configuration with polarizer and analyzer mutually parallel) may be less affected by TIS effects. This is because pupil point measurements are compared against measurements from the same pupil points from a different measurement. Therefore, for an instrument with perfect repeatability, any measured reflectivity differences can be attributed to a change of the measured object (e.g., difference between the test pads) and is unaffected by an un-calibrated pupil illumination asymmetry of the pupil, for instance. Birefringence, on the other hand, can lead to a situation where the reciprocity theorem becomes invalid which leads to a break of the symmetry of the reflectivities as a function of overlay.

In applications where WIS is an issue, differential measurements alone may not reveal the magnitude of the WIS. Accordingly, it may be necessary to adopt certain additional measures to determine WIS. For example, in some embodiments, an optical response of the test pad structure including the overlay and further feature asymmetry parameters responsible for WIS can be modeled. Alternatively, or additionally, WIS can be determined in a separate measurement using a test pad with known overlay. Again, a predetermined WIS should be used for very similar structures.

As explained above, overlay can be measured in a variety of different ways using PUPS technology. In general, a particular measurement strategy can be selected based on one or more of the following criteria. For example, the measurement strategy can consider how well other test object parameters (e.g., CD parameters, film thicknesses or materials) are known a priori for the given structure. Where such information is well known, methods assisted by optical modeling are applicable (e.g., last two examples in TABLE 1 or last example in TABLE 2).

Another consideration is how many test pads is the chip manufacturer willing to populate his wafers with, since certain methodologies may require multiple different test pads. A further consideration is what level of electromagnetic simulations (which can be costly in terms of time) is acceptable for the measurements. Other considerations include whether a PUPS tool with a dissimilar polarizer/analyzer configuration (preferably in orthogonal orientation) is available; whether the manufacturing process allow intentional overlay offsets; how large is the expected overlay range; the accuracy and precision requirements of the process; repeatability of the measurements; and/or how much signal asymmetry is caused by the instrument.

Depending on the above criteria, one or more of the following exemplary methodologies may be adopted for the determination of overlay. For example, in some implementations, a PUPS instrument having a parallel polarizer/analyzer configuration can be used with only one test pad (per direction) with a nominal offset present. One or multiple measurements can be taken on the test pad. Electromagnetic modeling is used in conjunction with the measurement to determine sample parameters, including the overlay, that explain the measured signal. Such configurations can provide a large number of data points for each measurement (e.g., corresponding to multiple wavelengths, angles of incidence and/or azimuth angles).

As another example, in some embodiments, a PUPS instrument having a dissimilar polarizer/analyzer configuration can be used with only one test pad (per direction) with or without a nominal offset. One or multiple measurements are taken for each test pad. Electromagnetic modeling is used to determine sample parameters, including the overlay, that explain the measured signal. Such configurations can provide a large number of data points for each measurement (e.g., corresponding to multiple wavelengths, angles of incidence and/or azimuth angles).

In a further example, an instrument is used in a regular PUPS configuration (polarizer and analyzer parallel) with at least three test pads (per direction), each with a different nominal offset. Measurements are taken on every test pad and the overlay error is calculated using the formulas given in the first or second example of TABLE 1, for example. A large number of data points is available (e.g., multiple wavelengths, angles of incidence and azimuth angles) and electromagnetic simulations are not required.

In another example, an instrument is used in a regular PUPS configuration (polarizer and analyzer parallel) and the CD, and film and material parameters of the sample are known and allow the determination of higher order coefficients of the signal parameterization by means of simulation. At least two test pads (per direction) with different nominal offsets are present and measurements are taken on every test pad. The overlay error is calculated using the formulas given in the third or fourth example of TABLE 1, for example. A large number of data points is available (e.g., multiple wavelengths, angles of incidence and azimuth angles).

In another example, an instrument is used in a regular PUPS configuration (polarizer and analyzer parallel) with at least two test pads (per direction), each with different nominal offsets. Measurements are taken on every test pad and the CD, film and material parameters of the sample are determined using regular PUPS algorithms applied to the averaged or otherwise combined measurements from all or a subset of test pads. The CD, film and material parameters found in the previous step allow the determination of higher order coefficients of the signal parameterization. They can either be retrieved from a pre-calculated coefficient library or simulated on demand. The overlay error is calculated using the formulas given in the third or fourth example of TABLE 1, for example. A large number of data points is available (e.g., multiple wavelengths, angles of incidence and azimuth angles).

In a further example, one or two instruments are used to measure samples in a regular PUPS configuration (parallel polarizer/analyzer) and in an orthogonal polarizer/analyzer configuration. One test pad (per direction) is used, with no intentional overlay offset present. Unknown CD, film and material parameters are determined after performing a regular PUPS measurement (parallel polarizer/analyzer). The determined CD, film and material parameters allow the determination of higher order coefficients of the signal parameterization. They can either be retrieved from a pre-calculated coefficient library or simulated on demand. The overlay error can be calculated using the formulas given in the second example in TABLE 1, for instance. A large number of data points is available (e.g., multiple wavelengths, angles of incidence and azimuth angles).

In another example, a PUPS instrument is in an orthogonal polarizer/analyzer configuration and at least two test pads (per direction) having different nominal offsets are used. Measurements are taken on every test pad and the overlay error is calculated using the formulas given in the first, third or fourth example of TABLE 1, for instance. A large number of data points is available (e.g., multiple wavelengths, angles of incidence and azimuth angles) and electromagnetic simulations are not required.

In some embodiments, measurements in the parallel polarizer/analyzer configuration are done multiple times using different orientations of the sample grating lines with respect to the polarizer. In some cases, additional measurements (e.g., after wafer or tool rotation by 180°) are taken in order to enable a TIS correction. Alternatively, or additionally, either the signals or the overlay error result can be TIS-corrected using a TIS that was determined with the same instrument on similar structures. TIS can be compensated by including instrument asymmetries in the modeling. The same number or more test pads can be used that are structured periodically in two dimensions and therefore carry overlay information for the two dimensions. Here, the overlay in both dimensions can be determined using two sets of formulas.

While a particular interferometry system is shown in FIG. 1, in general, the methods can be implemented using with a wide variety of optical interferometric systems that provide pupil plane imaging. For example, while the light source described for interferometry system 100 is a broadband light source, in general, interferometry systems used for overlay measurements may use monochromatic or broadband light sources. Further, the light source can be a spatially extended light source, e.g., filling the pupil of the objective (e.g., Köhler illumination); but a single source point imaged onto the sample is also feasible and also provides data for an extended range of illumination angles (e.g., for the full pupil).

Furthermore, interferometry systems used for overlay measurements can, in embodiments, be used for other types of metrology as well. For example, interferometry system 100 can be used for CD measurements in addition to overlay measurements. Alternatively, or additionally, interferometry systems can also be adapted for additional functionality by switching between various hardware configurations. For example, the system hardware can be switched between conventional SWLI imaging and PUPS imaging, allowing, e.g., surface profile measurements to be made alongside CD and overlay measurement. In some embodiments, both imaging modes can be used to make overlay measurements, in which case the final overlay error can be determined as an average of the two measurements. Methods using SWLI for overlay measurements are described, e.g., in U.S. patent application Ser. No. 12/427,079, entitled "INTERFEROMETER FOR OVERLAY MEASUREMENTS," filed on Apr. 21, 2009, the entire contents of which is incorporated herein by reference.

Figure 17:
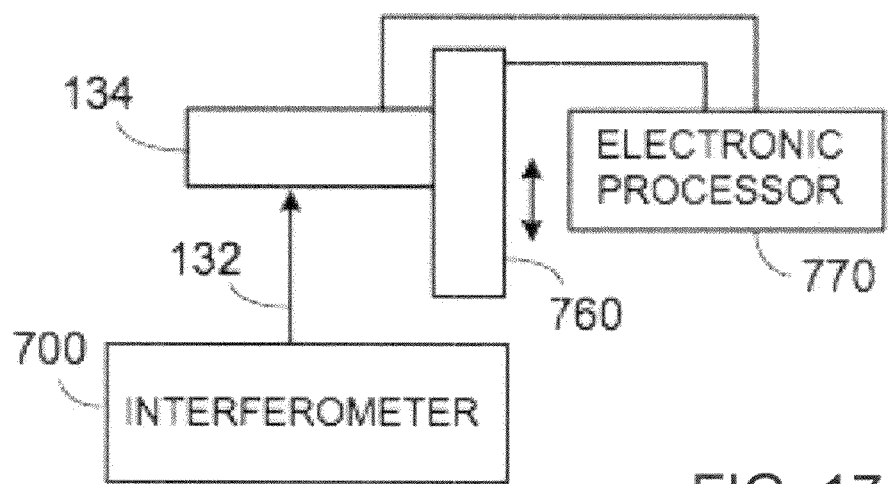
FIG. 17 is a schematic diagram of an embodiment of an interferometry system.
Figure 18:
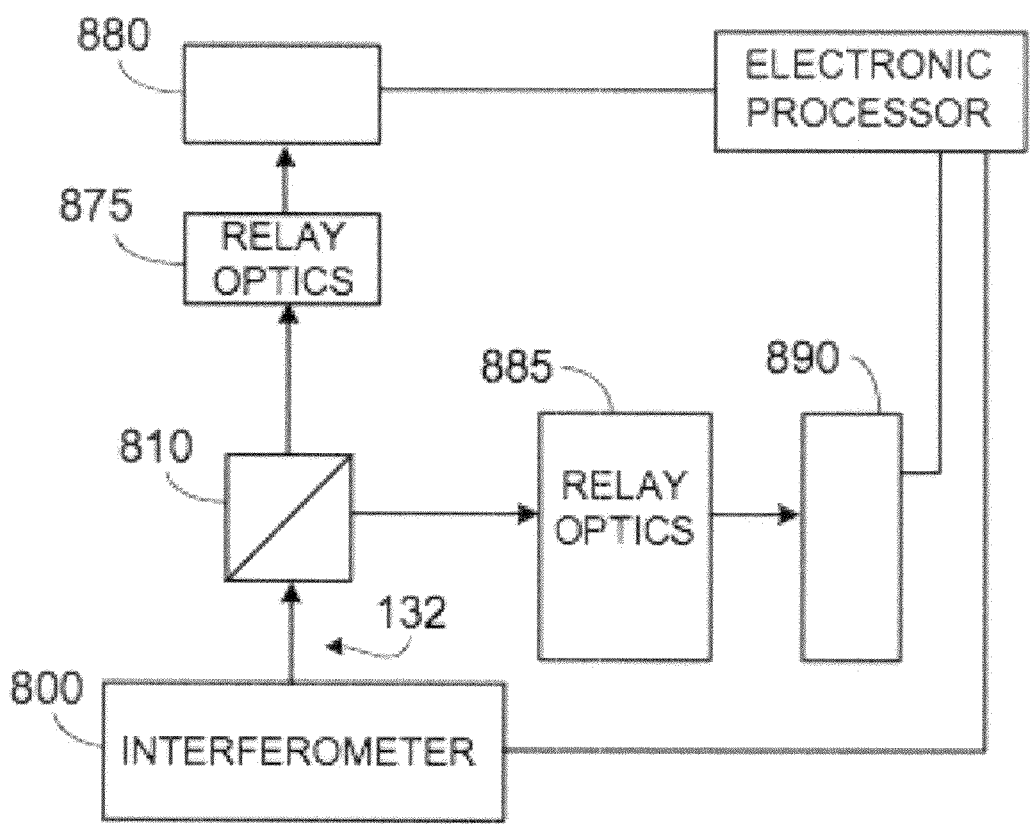
FIG. 18 is a schematic diagram of another embodiment of an interferometry system.
Figure 19:
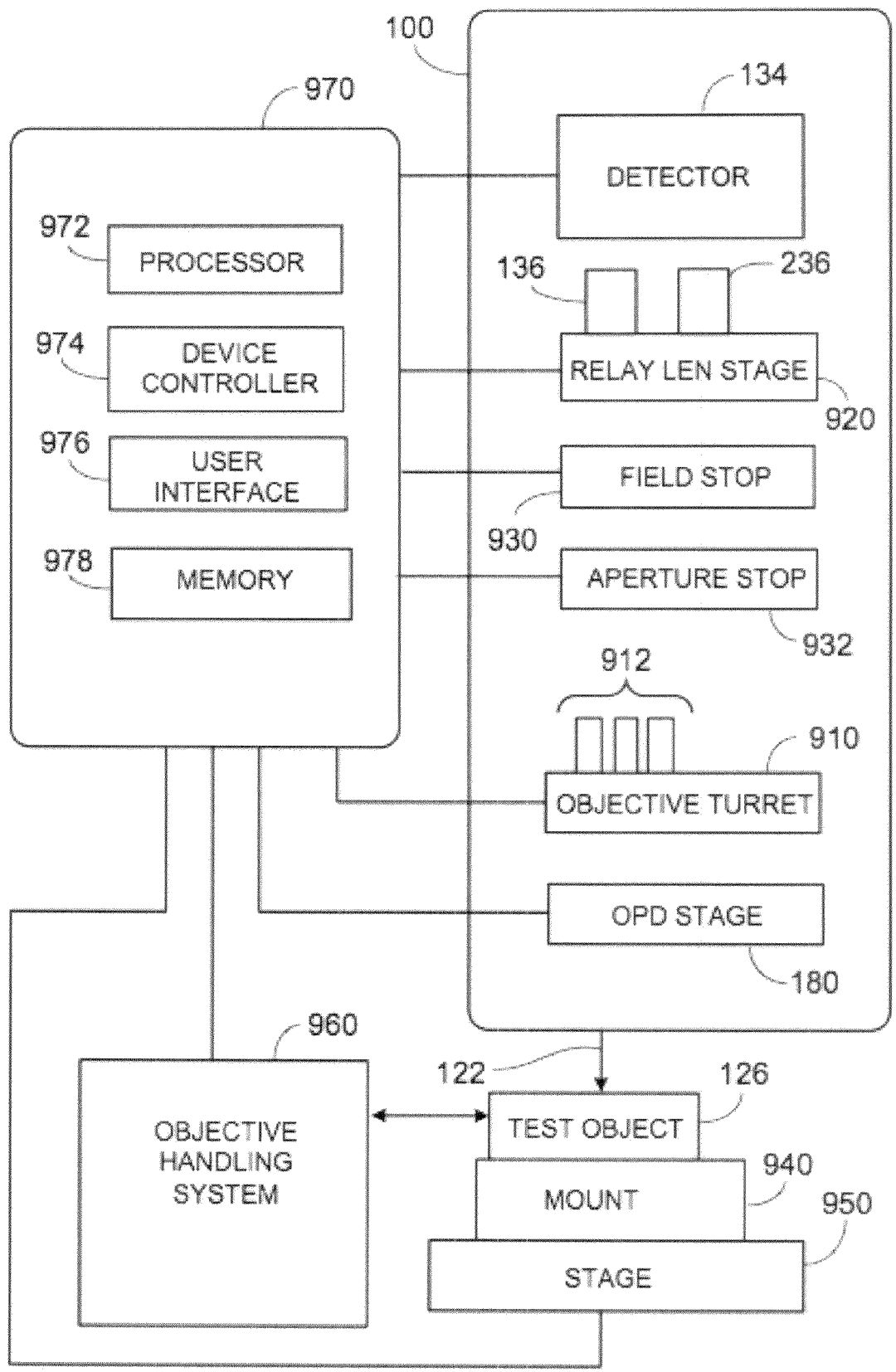
FIG. 19 is a schematic diagram of an interferometry system showing how various components can be adjusted in an automated fashion under the control of an electronic processor.

FIG. 17 shows a schematic diagram of how various components in interferometry system 100 can be automated under the control of electronic processor 970, which, in the presently described embodiment, can include an analytical processor 972 for carrying out mathematical analyses, device controllers 974 for controlling various components in the interferometry system, a user interface 976 (e.g., a keyboard and display), and a storage medium 978 for storing calibration information, data files, a sample models, and/or automated protocols.

First, the system can include a motorized turret 910 supporting multiple objectives 912 and configured to introduce a selected objective into the path of input light 104. One or more of the objectives can be interference objectives, with the different interference objectives providing different magnifications. Furthermore, in certain embodiments, one (or more) of the interference objectives can be especially configured for the ellipsometry mode (e.g., PUPS mode) of operation by having polarization element 146 (e.g., a linear polarizer) attached to it. The remaining interference objectives can be used in the profiling mode and, in certain embodiments, can omit polarization element 146 so as to increase light efficiency (such as for the embodiment described above in which beam splitter 112 is a polarizing beam splitter and polarization element is 142 is a quarter wave plate). Moreover, one or more of the objectives can be a non-interferometric objective (i.e., one without a reference leg), each with a different magnification, so that system 100 can also operate in a conventional microscope mode for collecting optical images of the test surface (in which case the relay lens is set to image of test surface to the detector). Turret 910 is under the control of electronic processor 970, which selects the desired objective according to user input or some automated protocol.

Next, the system includes a motorized stage 920 (e.g., a tube lens holder) for supporting relay lenses 136 and 236 and selectively positioning one of them in the path of combined light 132 for selecting between the first mode (e.g., an ellipsometry or reflectometry mode) in which the pupil plane 114 is imaged to the detector and the second mode (e.g., profiling/overlay or microscope mode) in which the test surface is imaged to the detector. Motorized stage 920 is under the control of electronic processor 970, which selects the desired relay lens according to user input or some automated protocol. In other embodiments, in which a translation stage is moved to adjust the position of the detector to switch between the first and second modes, the translation is under control of electronic processor. Furthermore, in those embodiments with two detection channels, each detector is coupled to the electronic processor 970 for analysis.

Furthermore, the system can include motorized apertures 930 and 932 under control of electronic processor 970 to control the dimensions of field stop 138 and aperture stop 115, respectively. Again the motorized apertures are under the control of electronic processor 970, which selects the desired settings according to user input or some automated protocol.

Also, translation stage 150, which is used to vary the relative optical path length between the test and reference legs of the interferometer, is under the control of electronic processor 970. As described above, the translation stage can be coupled to adjust the position of the interference objective relative to a mount 940 for supporting test object 126. Alternatively, in further embodiments, the translation stage can adjust the position of the interferometry system as a whole relative to the mount, or the translation stage can be coupled to the mount, so it is the mount that moves to vary the optical path length difference.

Furthermore, a lateral translation stage 950, also under the control of electronic processor 970, can be coupled to the mount 940 supporting the test object to translate laterally the region of the test surface under optical inspection. In certain embodiments, translation stage 950 can also orient mount 940 (e.g., provide tip and tilt) so as to align the test surface normal to the optical axis of the interference objective.

Finally, an object handling station 960, also under control of electronic processor 970, can be coupled to mount 940 to provide automated introduction and removal of test samples into system 100 for measurement. For example, automated wafer handling systems known in the art can be used for this purpose. Furthermore, if necessary, system 100 and object handling system can be housed under vacuum or clean room conditions to minimize contamination of the test objects.

The resulting system provides great flexibility for providing various measurement modalities and procedures. For example, the system can first be configured in the microscope mode with one or more selected magnifications to obtain optical images of the test object for various lateral positions of the object. Such images can be analyzed by a user or by electronic processor 970 (using machine vision techniques) to identify certain regions (e.g., specific structures or features, landmarks, fiducial markers, defects, etc.) in the object. Based on such identification, selected regions of the sample can then be studied in the ellipsometry mode to determine sample properties (e.g., refractive index, underlying film thickness(es), material identification, etc.).

Accordingly, the electronic processor causes stage 920 to switch the relay lens to the one configured for the ellipsometry mode and further causes turret 910 to introduce a suitable interference objective into the path of the input light. To improve the accuracy of the ellipsometry measurement, the electronic processor can reduce the size of the field stop via motorized aperture 930 to isolate a small laterally homogenous region of the object. After the ellipsometry characterization is complete, electronic processor 970 can switch the instrument to the profiling mode, selecting an interference objective with a suitable magnification and adjusting the size of field stop accordingly. The profiling/overlay mode captures interference signals that allow reconstructing the topography of, for example, one or more interfaces that constitute the object. Notably, the knowledge of the optical characteristics of the various materials determined in the ellipsometry mode allows for correcting the calculated topography for thin film or dissimilar material effects that would otherwise distort the profile. See, for example, U.S. patent application Ser. No. 10/795,579 entitled "PROFILING COMPLEX SURFACE STRUCTURES USING SCANNING INTERFEROMETRY" and published as U.S. Patent Publication No. US-2004-0189999-A1, which is incorporated by reference. If desired, the electronic processor can also adjust the aperture stop diameter via motorized aperture 932 to improve the measurement in any of the various modes.

When used in conjunction with automated object handling system 960, the measurement procedure can be repeated automatically for a series of samples. This could be useful for various process control schemes, such as for monitoring, testing, and/or optimizing one or more semiconductor processing steps.

For example, the system can be used in a semiconductor process for tool specific monitoring or for controlling the process flow itself. In the process monitoring application, single/multi-layer films are grown, deposited, polished, or etched away on unpatterned Si wafers (monitor wafers) by the corresponding process tool and subsequently the thickness and/or optical properties are measured using the interferometry system disclosed herein (for example, by using the ellipsometry mode, the profiling/overlay mode, or both). The average, as well as within wafer uniformity, of thickness (and/or optical properties) of these monitor wafers are used to determine whether the associated process tool is operating with targeted specification or should be retargeted, adjusted, or taken out of production use.

In the process control application, latter single/multi-layer films are grown, deposited, polished, or etched away on patterned Si, production wafers by the corresponding process tool and subsequently the thickness and/or optical properties are measured with the interferometry system disclosed herein (for example, by using the ellipsometry mode, the profiling mode, or both). Production measurements used for process control typical include a small measurement site and the ability to align the measurement tool to the sample region of interest. This site may consists of multi-layer film stack (that may itself be patterned) and thus requires complex mathematical modeling in order to extract the relevant physical parameters. Process control measurements determine the stability of the integrated process flow and determine whether the integrated processing should continue, be retargeted, redirected to other equipment, or shut down entirely.

Specifically, for example, the interferometry system disclosed herein can be used to monitor the following equipment: diffusion, rapid thermal anneal, chemical vapor deposition tools (both low pressure and high pressure), dielectric etch, chemical mechanical polishers, plasma deposition, plasma etch, lithography track, and lithography exposure tools. Additionally, the interferometry system disclosed herein can be used to control the following processes: trench and isolation, transistor formation, as well as interlayer dielectric formation (such as dual damascene).

In some embodiments, light source 102 in system 100 of FIG. 1 is replaced by a tunable monochromatic source under the control of the electronic processor. For example, the source can be a tunable laser diode or a broadband source incorporating a tunable spectral filter to produce a tunable spectral output (e.g., a monochromator, a spectral filter wheel, an acousto-optic tunable filter or a tunable liquid crystal filter.) Furthermore, the position of reference surface 125 (e.g., a reference minor) is adjusted so that the optical path length difference between the test light and reference light when the test surface is in-focus with respect to the interference objective is non-zero. Detector 134 records the interference pattern produced by the combined light as the wavelength of the source is scanned. There is no mechanical motion of the object with respect to the interferometric objective in this case. Because of the adjustment in the position of the reference mirror and the resulting non-zero optical path length difference between the test and reference legs of the interferometer, the scanning of the source frequency produces an interference signal that is measured at each detector element. This interference signal is sometimes referred to as a "channel spectrum."

The embodiment shown in FIG. 1 uses an interference objective of the Mirau-type, in which the beam splitter in the interference objective directs the reference light back along the optical axis for the test light. In other embodiments, interferometry system 100 can instead use a different type of interference objective, such as a Michelson objective, in which the beam splitter directs the reference light away from the optical axis of the test light (e.g., the beam splitter can be oriented at 45 degrees to the input light so the test light and reference travel at right angles to one another). In such cases, the reference surface can be positioned outside of the path of the test light.

In some embodiments, the interference objective can be of the Linnik-type, in which case the beam splitter is positioned prior to the objective lens for the test surface (with respect to the input light) and directs the test and reference light along different paths. A separate objective lens is used to focus the reference light to the reference lens. In other words, the beam splitter separates the input light into the test and reference light, and separate objective lenses then focus the test and reference light to respective test and reference surfaces. Ideally the two objective lenses are matched to one another so that the test and reference light have similar aberrations and optical paths.

Additional interferometer configurations are also possible. For example, the system can be configured to collect test light that is transmitted through the test sample and then subsequently combined with reference light. For such embodiments, for example, the system can implement a Mach-Zehnder interferometer with dual microscope objectives on each leg.

The light source in the interferometer may be any of: an incandescent source, such as a halogen bulb or metal halide lamp, with or without spectral bandpass filters; a broadband laser diode; a light-emitting diode; a supercontinuum light source (as mentioned above); a combination of several light sources of the same or different types; an arc lamp; any source in the visible spectral region; any source in the IR spectral region, particularly for viewing rough surfaces & applying phase profiling; and any source in the UV spectral region, particularly for enhanced lateral resolution. For broadband applications, the source preferably has a net spectral bandwidth broader than 5% of the mean wavelength, or more preferably greater than 10%, 20%, 30%, or even 50% of the mean wavelength. For tunable, narrow-band applications, the tuning range is preferably broad (e.g., greater than 50 nm, greater than 100 nm, or greater than even 200 nm, for visible light) to provide reflectivity information over a wide range of wavelengths, whereas the spectral width at any particular setting is preferable narrow, to optimize resolution, for example, as small as 10 nm, 2 nm, or 1 nm. The source may also include one or more diffuser elements to increase the spatial extent of the input light being emitted from the source.

Furthermore, the various translations stages in the system, such as translation stage 150, may be: driven by any of a piezo-electric device, a stepper motor, and a voice coil; implemented opto-mechanically or opto-electronically rather than by pure translation (e.g., by using any of liquid crystals, electro-optic effects, strained fibers, and rotating waveplates) to introduce an optical path length variation; any of a driver with a flexure mount and any driver with a mechanical stage, e.g. roller bearings or air bearings.

The electronic detector can be any type of detector for measuring an optical interference pattern with spatial resolution, such as a multi-element CCD or CMOS detector.

The analysis steps described above can be implemented in computer programs using standard programming techniques. Such programs are designed to execute on programmable computers or specifically designed integrated circuits, each comprising an electronic processor, a data storage system (including memory and/or storage elements), at least one input device, and least one output device, such as a display or printer. The program code is applied to input data (e.g., images from the detector) to perform the functions described herein and generate output information (e.g., overlay error, refractive index information, thickness measurement(s), surface profile(s), etc.), which is applied to one or more output devices. Each such computer program can be implemented in a high-level procedural or object-oriented programming language, or an assembly or machine language. Furthermore, the language can be a compiled, interpreted or intermediate language. Each such computer program can be stored on a computer readable storage medium (e.g., CD ROM or magnetic diskette) that when read by a computer can cause the processor in the computer to perform the analysis and control functions described herein.

Interferometry metrology systems, such as those discussed previously, can be used in the production of integrated circuits to monitor and improve overlay between patterned layers. For example, the interferometry systems and methods can be used in combination with a lithography system and other processing equipment used to produce integrated circuits. In general, a lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Figure 20A:
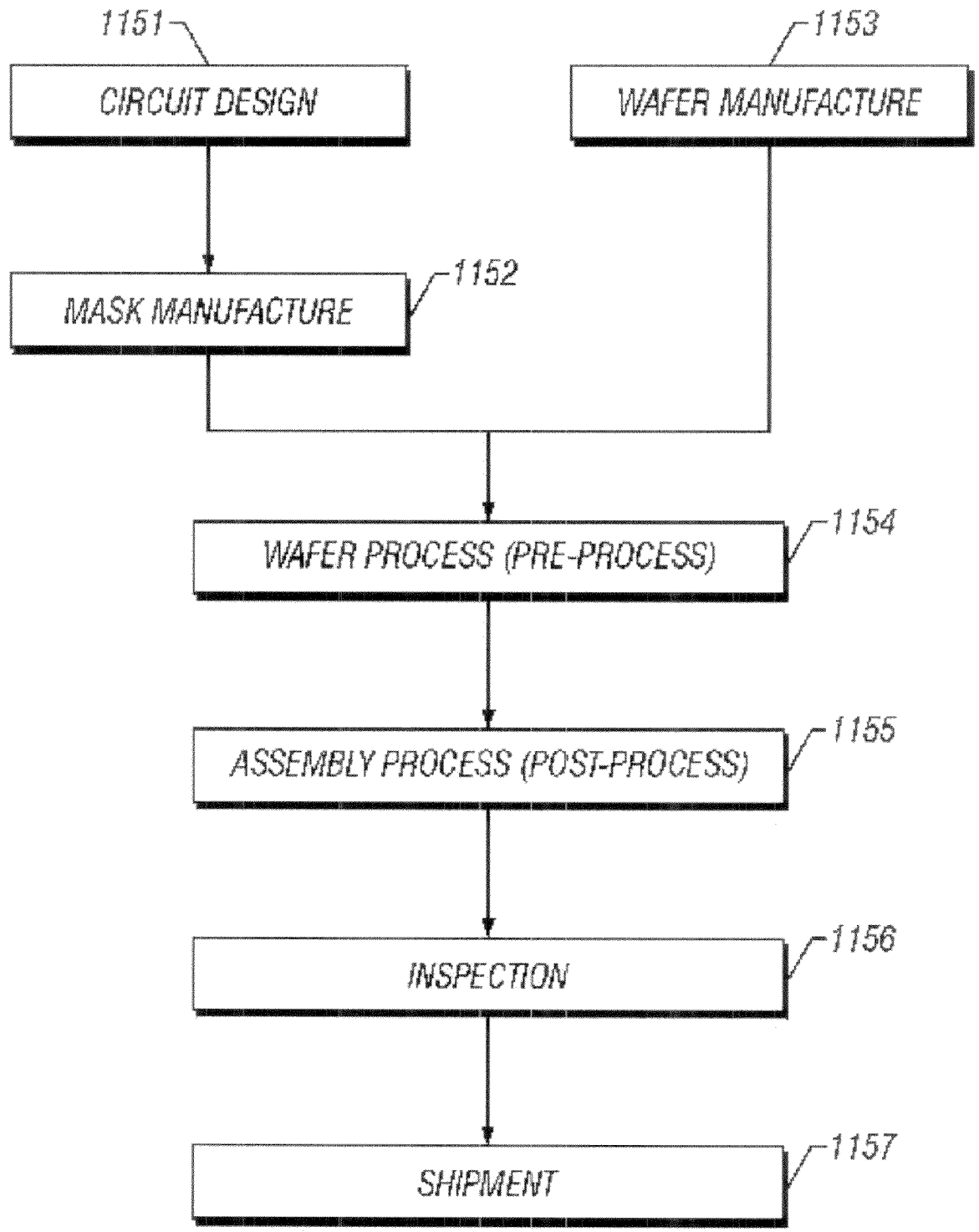
FIG. 20(a) and FIG. 20(b) are flow charts that describe steps for producing integrated circuits.
Figure 20B:
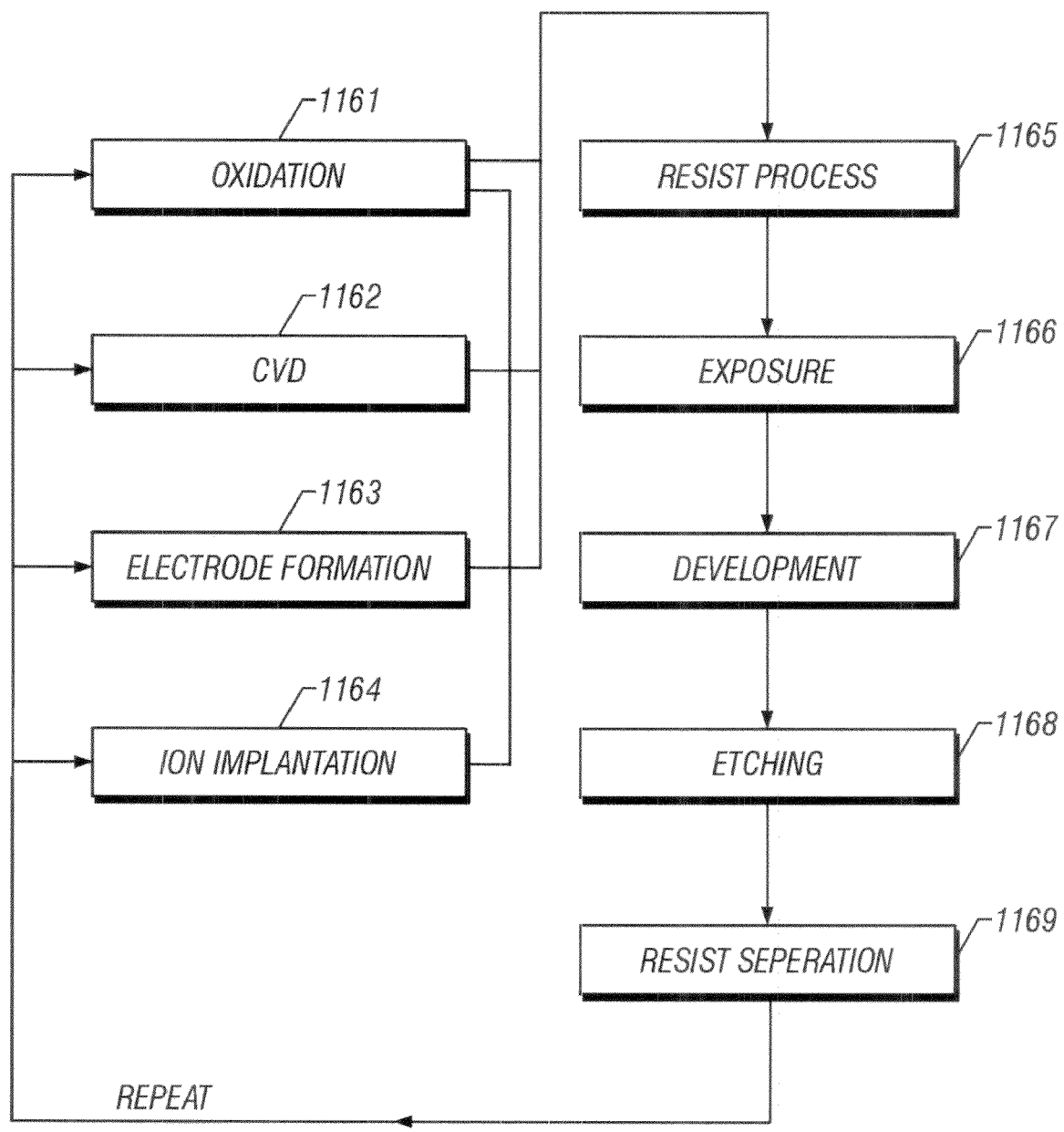

As is well known in the art, lithography is a critical part of manufacturing methods for making semiconducting devices. For example, U.S. Pat. No. 5,483,343 outlines steps for such manufacturing methods. These steps are described below with reference to FIGS. 20(*a*) and 20(*b*). FIG. 20(*a*) is a flow chart of the sequence of manufacturing a semiconductor device such as a semiconductor chip (e.g., IC or LSI), a liquid crystal panel or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the so prepared mask and wafer, circuits are formed on the wafer through lithography. To form circuits on the wafer, patterns from multiple masks are sequentially transferred to different layers on the wafer, building up the circuits. Effective circuit production requires accurate overlay between the sequentially formed layers. The interferometry methods and systems described herein can be especially useful to provide accurate overlay and thereby improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

FIG. 20(*b*) is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein can improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

As mentioned previously, the interferometry systems and methods disclosed herein can be used in the manufacture of flat panel displays such as, for example, liquid crystal displays (LCDs).

Figure 21:
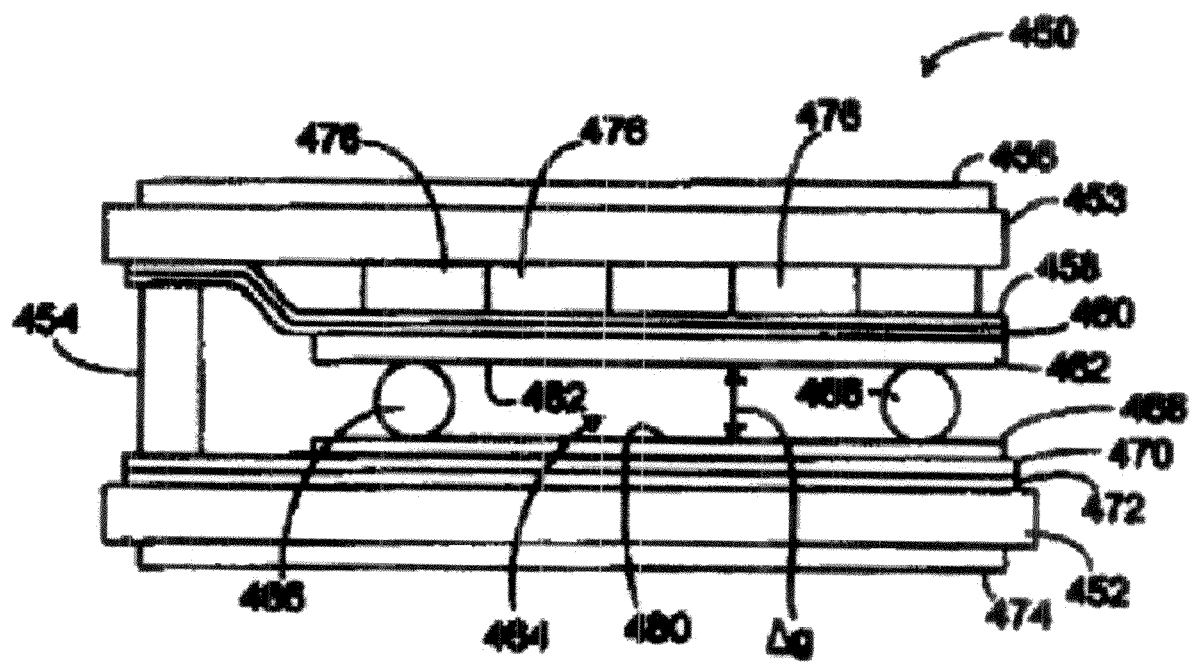
FIG. 21 is a schematic diagram of an embodiment of a LCD panel composed of several layers.

In general, a variety of different LCD configurations are used in many different applications, such as LCD televisions, desktop computer monitors, notebook computers, cell phones, automobile GPS navigation systems, automobile and aircraft entertainment systems to name a few. While the specific structure of a LCD can vary, many types of LCD utilize a similar panel structure. Referring to FIG. 21, for example, in some embodiments, a LCD panel 450 is composed of several layers including two glass plates 452,453 connected by seals 454. Glass plates 452 and 453 are separated by a gap 464, which is filled with a liquid crystal material. Polarizers 456 and 474 are applied to glass plates 453 and 452, respectively. One of the polarizers operates to polarize light from the display's light source (e.g., a backlight, not shown) and the other polarizer serves as an analyzer, transmitting only that component of the light polarized parallel to the polarizer's transmission axis.

An array of color filters 476 is formed on glass plate 453 and a patterned electrode layer 458 is formed on color filters 476 from a transparent conductor, commonly Indium Tin Oxide (ITO). A passivation layer 460, sometimes called hard coat layer, based on SiOx is coated over the electrode layer 458 to electrically insulate the surface. Polyimide 462 is disposed over the passivation layer 460 to align the liquid crystal fluid 464.

Panel 450 also includes a second electrode layer 472 formed on glass plate 452. Another hard coat layer 470 is formed on electrode layer 472 and another polyimide layer 468 is disposed on hard coat layer 470. In active matrix LCDs ("AM LCDs"), one of the electrode layers generally includes an array of thin film transistors (TFTs) (e.g., one or more for each sub-pixel) or other integrated circuit structures.

The liquid crystal material is birefringent and modifies the polarization direction of the light propagating through the material. The liquid crystal material also has a dielectric anisotropy and is therefore sensitive to electric fields applied across gap 464. Accordingly, the liquid crystal molecules change orientation when an electric field is applied, thereby varying the optical properties of the panel. By harnessing the birefringence and dielectric anisotropy of the liquid crystal material, one can control the amount of light transmitted by the panel.

The cell gap Δg, i.e., thickness of the liquid crystal layer 464, is determined by spacers 466, which keep the two glass plates 452,453 at a fixed distance. In general, spacers can be in the form of preformed cylindrical or spherical particles having a diameter equal to the desired cell gap or can be formed on the substrate using patterning techniques (e.g., conventional photolithography techniques).

In general, LCD panel manufacturing involves multiple process steps in forming the various layers. For example, referring to FIG. 22, a process 499 includes forming the various layers on each glass plate in parallel, and then bonding the plates to form a cell. The cell is then filled with the liquid crystal material and sealed. After sealing, the polarizers are applied to the outer surface of each of the glass plates, providing the completed LCD panel.

Figure 22:
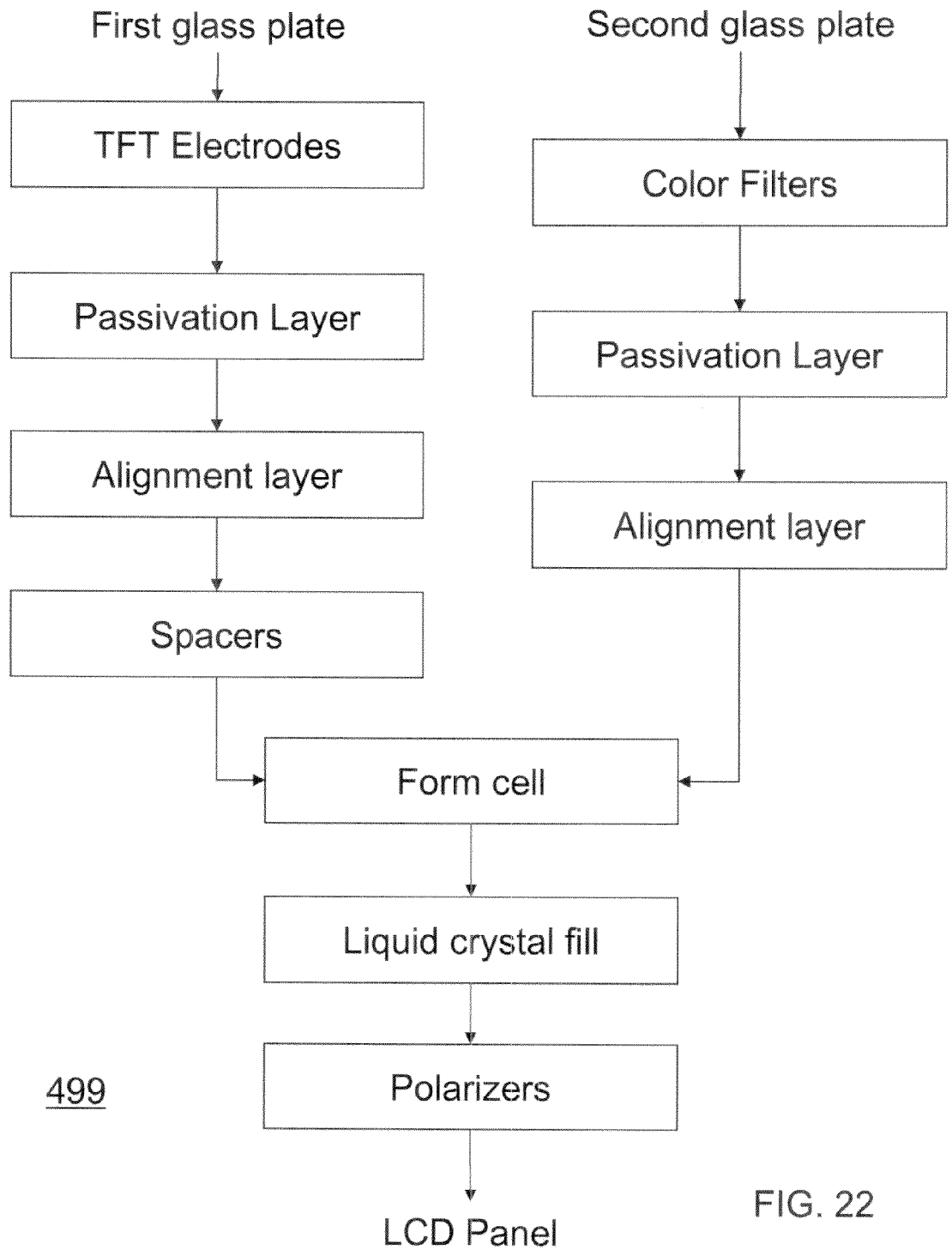
FIG. 22 is a flowchart showing various steps in LCD panel production.

In general, formation of each of the components illustrated in the flow chart in FIG. 22 can include multiple process steps. For example, in the present example, forming the TFT electrodes (commonly referred to as "pixel electrodes") on the first glass plate involves many different process steps. Similarly, forming the color filters on the second glass plate can involve numerous process steps. Typically, forming pixel electrodes include multiple process steps to form the TFTs, ITO electrodes, and various bus lines to the TFTs. In fact, forming the TFT electrode layer is, in essence, forming a large integrated circuit and involves many of the same deposition and photolithographic patterning processing steps used in conventional integrated circuit manufacturing. For example, various parts of the TFT electrode layer can be built by first depositing a layer of material (e.g., a semiconductor, conductor, or dielectric), forming a layer of photoresist over the layer of material, exposing the photoresist to patterned radiation. The photoresist layer is then developed, which results in a patterned layer of the photoresist. Next, portions of the layer of material lying beneath the patterned photoresist layer are removed in a etching process, thereby transferring the pattern in the photoresist to the layer of material. Finally, the residual photoresist is stripped from the substrate, leaving behind the patterned layer of material. These process steps can be repeated many times to lay down the different components of the TFT electrode layer.

In general, the interferometry techniques disclosed herein can be used to monitor overlay of different components of an LCD panel. For example, during panel production, the interferometry techniques can be used to determine overlay error between patterned resist layers and features beneath the photoresist layer. Where measured overlay error is outside a predetermined process window, the patterned photoresist can be stripped from the substrate and a new patterned photoresist layer formed.

Other embodiments are in the following claims.

What is claimed is:

1. A system comprising:
   an interferometer configured to direct test light to an overlay test pad and subsequently combine it with reference light, the test and reference light being derived from a common source;
   one or more optics configured to direct at least a portion of the combined light to a multi-element detector so that different regions of the detector correspond to different illumination angles of the overlay test pad by the test light, the detector being configured to produce an interference signal based on the combined light; and
   an electronic processor in communication with the multi-element detector,
   wherein the overlay test pad comprises a first patterned structure and a second patterned structure and the electronic processor is configured to determine information about the relative alignment between the first and second patterned structures based on the interference signal.

2. The system of claim 1, wherein the information about the relative alignment comprises an overlay error between the first patterned structure and the second patterned structure along a first direction.

3. The system of claim 2, wherein the system is configured to derive a value of a signal from the interference signal, where the signal has a non-zero derivative with respect to the overlay error for a range of displacements of the first patterned structure relative to the second patterned structure along the first direction including a displacement corresponding to a zero overlay error.

4. The system of claim 2, wherein the overlay error is a displacement of the first patterned structure from the second patterned structure along the first direction relative to a nominal position.

5. The system of claim 4, wherein the nominal position corresponds to a non-zero offset between the first and second patterned structures in the first direction.

6. The system of claim 4, wherein the nominal position corresponds to a zero-offset between the first and second patterned structures in the first direction.

7. The system of claim 1, wherein the interferometer defines a pupil and the one or more optics are configured to image the pupil onto the multi-element detector.

8. The system of claim 1, further comprising a polarizer positioned in a path of the test light prior to the overlay test pad and an analyzer positioned in the path of the test light after the overlay test pad.

9. The system of claim 8, wherein the transmission axes of the polarizer and analyzer are parallel.

10. The system of claim 8, wherein the transmission axes of the polarizer and analyzer are non-parallel.

11. The system of claim 10, wherein the transmission axes of the polarizer and analyzer are orthogonal.

12. The system of claim 1, further comprising a waveplate positioned in a path of the test light.

13. The system of claim 1, further comprising a translation stage configured to adjust the relative optical path length between the test and reference light when they form the interference pattern.

14. The system of claim 13, further comprising a base for supporting a test object having the overlay test pad, and wherein the translation stage is configured to move at least a portion of the interferometer relative to the base.

15. The system of claim 14, further comprising the common source, wherein the translation stage is configured to vary the optical path length over a range larger than a coherence length for the common source.

16. The system of claim 1, wherein the first patterned structure is a first grating.

17. The system of claim 16, wherein the second patterned structure is a second grating.

18. The system of claim 17, wherein the first and second gratings are in different layers of the overlay test pad.

19. The system of claim 1, wherein the electronic processor determines the information about the relative alignment based on optical modeling of the first and second patterned structures.

20. The system of claim 1, wherein the electronic processor determines the information about the relative alignment based on differences between measurements taken on multiple test pads having known offset differences.

21. The system of claim 1, wherein the electronic processor determines the information about the relative alignment based on a combination of optical modeling and empirical data obtained from the interference signal.

22. The system of claim 1, wherein the information about the relative alignment comprises an overlay error between the first patterned structure and the second patterned structure along a first direction and an overlay error between the first patterned structure and the second patterned structure along a second direction different from the first direction.

23. The system of claim 1, wherein the interferometer comprises a beam splitter configured to separate input light derived from the common source into the test light and the reference light, and a reference surface positioned to reflect the reference light before it is combined with the test light.

24. The system of claim 23, wherein test light is configured to reflect from the overlay test pad, and the beam splitter in the interferometer is positioned to recombine the test and reference light after they reflect from the respective test and reference surfaces.

25. The system of claim 1, wherein the common source is spatially extended.

26. The system of claim 1, further comprising the source, wherein the common source is a broadband source spanning more than 50 nm at full width half maximum.

27. The system of claim 1, wherein the interferometer and one or more optics are part of an interference microscope.

28. The system of claim 27, wherein the interference microscope comprises a Mirau objective.

29. The system of claim 27, wherein the interference microscope comprises a Linnik objective.

30. The system of claim 1, wherein the system is part of a lithography tool.

31. The system of claim 30, wherein the electronic processor is configured to account for tool-induced-shift when determining the information.

32. The system of claim 30, wherein the electronic processor is configured to account for wafer-induced-shift when determining the information.

33. A process for making a display panel, comprising:
providing a component of the display panel, the component supporting an overlay test pad;
determining information about the overlay test pad using the system of claim 1; and
forming the display panel using the component based on the information about the overlay test pad.

34. A process for making an integrated circuit, comprising:
providing a substrate comprising one or more integrated circuit structures;
determining information about the one or more integrated circuit structures using the system of claim 1, where the substrate comprises the overlay test pad and the information is information about the overlay test pad; and
forming the integrated circuit using the substrate based on the information.

35. An interferometry method, comprising:
directing test light to an overlay test pad;
subsequently combining the test light with reference light to form an interference pattern on a multi-element detector so that different regions of the detector correspond to different illumination angles of the overlay test pad by the test light, wherein the test and reference light are derived from a common source and the overlay test pad comprises a first patterned structure and a second patterned structure;
monitoring the interference pattern while varying an optical path difference between the test light and the reference light; and
determining information about the relative alignment between the first and second patterned structures based on the interference pattern.

36. The interferometry method of claim 35, wherein the information about the relative alignment comprises an overlay error between the first patterned structure and the second patterned structure along a first direction.

37. The interferometry method of claim 36, wherein determining the information comprises deriving a value of a signal from the interference pattern, where the signal has a non-zero derivative with respect to the overlay error for a range of displacements of the first patterned structure relative to the second patterned structure along the first direction including a displacement corresponding to a zero overlay error.

38. The interferometry method of claim 36, wherein the overlay error is a displacement of the first patterned structure from the second patterned structure along the first direction relative to a nominal position.

39. The interferometry method of claim 38, wherein the nominal position corresponds to a non-zero offset between the first and second patterned structures in the first direction.

40. The interferometry method of claim 38, wherein the nominal position corresponds to a zero-offset between the first and second patterned structures in the first direction.

41. The interferometry method of claim 35, wherein determining the information comprises determining a spatial frequency transform of the interference pattern.

42. The interferometry method of claim 41, wherein the transform is a Fourier transform.

43. The interferometry method of claim 35, wherein the method is performed using an interference microscope.

44. The interferometry method of claim 35, wherein the method is a low coherence interferometry method.

45. A process for making a display panel, comprising:
providing a component of the display panel, the component supporting an overlay test pad;
determining information about the overlay test pad using the method of claim 35; and
forming the display panel using the component based on the information about the overlay test pad.

46. A process for making an integrated circuit, comprising:
providing a substrate comprising one or more integrated circuit structures;
determining information about the one or more integrated circuit structures using the method of claim 35, where the substrate comprises the overlay test pad and the information is information about the overlay test pad; and
forming the integrated circuit using the substrate based on the information.

* * * * *